(12) United States Patent
Mao et al.

(10) Patent No.: US 10,454,312 B2
(45) Date of Patent: Oct. 22, 2019

(54) WIRELESS POWER TRANSFER CONTROL APPARATUS AND METHOD

(71) Applicant: x2 Power Technologies Limited, Grand Cayman (KY)

(72) Inventors: Hengchun Mao, Allen, TX (US); Bo Yang, Allen, TX (US); Zeng Li, Pudong (CN)

(73) Assignee: x2 Power Technologies Limited, Grand Cayman (KY)

(*) Notice: Subject to any disclaimer, the term of this patent is extended or adjusted under 35 U.S.C. 154(b) by 157 days.

(21) Appl. No.: 15/458,756

(22) Filed: Mar. 14, 2017

(65) Prior Publication Data

US 2017/0271924 A1 Sep. 21, 2017

Related U.S. Application Data

(60) Provisional application No. 62/308,684, filed on Mar. 15, 2016.

(51) Int. Cl.
| | |
|---|---|
| *H02J 50/12* | (2016.01) |
| *H03M 1/12* | (2006.01) |
| *H02J 7/02* | (2016.01) |
| *H02J 50/80* | (2016.01) |

(52) U.S. Cl.
CPC ............ *H02J 50/12* (2016.02); *H02J 7/025* (2013.01); *H02J 50/80* (2016.02); *H03M 1/1245* (2013.01)

(58) Field of Classification Search
USPC ............................................... 307/104
See application file for complete search history.

(56) References Cited

U.S. PATENT DOCUMENTS

| | | | |
|---|---|---|---|
| 9,178,438 B2 | 11/2015 | Fu et al. | |
| 2003/0048648 A1 | 3/2003 | Lin et al. | |
| 2006/0125455 A1* | 6/2006 | Tiew ............... | H02M 3/156 323/282 |
| 2012/0268075 A1 | 10/2012 | Wolf et al. | |
| 2014/0225439 A1* | 8/2014 | Mao ............... | H02M 3/3376 307/31 |
| 2015/0093989 A1* | 4/2015 | Plumb ............ | H02J 5/005 455/41.1 |
| 2016/0056639 A1 | 2/2016 | Mao | |
| 2018/0041221 A1* | 2/2018 | Xu ................. | H03M 1/068 |

* cited by examiner

*Primary Examiner* — Rexford N Barnie
*Assistant Examiner* — Xuan Ly
(74) *Attorney, Agent, or Firm* — Slater Matsil, LLP

(57) ABSTRACT

An apparatus comprises a sense transistor having a gate and a source directly connected to a gate and a source of a power transistor of a resonant converter respectively, wherein the resonant converter comprises a primary side and a secondary side magnetically coupled to the primary side, a current sense and amplification circuit comprising an amplifier having inputs connected to a drain of the sense transistor and a drain of the power transistor respectively, an analog-to-digital converter connected to an output of the current sense and amplification circuit and a digital controller connected to an output of the analog-to-digital converter, wherein the digital controller is configured to modulate a variable capacitance network of the resonant converter based upon a current flowing through the sense transistor.

18 Claims, 16 Drawing Sheets

WIRELESS POWER TRANSFER CONTROL APPARATUS AND METHOD

CROSS REFERENCE TO RELATED APPLICATIONS

This application is related to, and claims priority to, U.S. Provisional Application No. 62/308,684, titled, "Wireless Power Transfer Control Apparatus and Method" filed on Mar. 15, 2016, which is herein incorporated by reference.

TECHNICAL FIELD

The present invention relates to a control apparatus, method, and system, and, in particular embodiments, to a control apparatus, method, and system in a wireless power transfer system.

BACKGROUND

As technologies further advance, wireless power transfer (WPT) has emerged as an efficient and convenient mechanism for powering or charging mobile devices such as mobile phones, tablet PCs, digital cameras, MP3 players and/or the like. A wireless power transfer system typically comprises a primary side transmitter and one or more secondary side receivers. The primary side transmitter is magnetically coupled to the secondary side receiver(s) through a magnetic coupling. The magnetic coupling may be implemented as a loosely coupled transformer having a primary side coil formed in the primary side transmitter and a secondary side coil formed in a secondary side receiver.

FIG. 1 illustrates a block diagram of a wireless power transfer system. The wireless power transfer system 100 shown in FIG. 1 is an exemplary system recommended by the Alliance for Wireless Power (A4WP) organization. The wireless power transfer system 100 shown in FIG. 1 includes a power transmitter and a power receiver. Through magnetic coupling, power is transferred from the power transmitter to the power receiver.

The power transmitter includes a transmitter dc/dc converter, a power amplifier, an impedance matching circuit and a resonant circuit connected in cascade between a power input and a transmitter coil. The power transmitter may further comprise a transmitter Bluetooth unit having a first input/output coupled to a receiver Bluetooth unit and a second input/output coupled to the transmitter dc/dc converter of the power transmitter.

The power receiver includes a resonant circuit, a rectifier, a receiver dc/dc converter connected in cascade between a receiver coil and a load. The power receiver may further comprise the receiver Bluetooth unit having an input/output coupled to the transmitter Bluetooth unit. More receivers with the same architecture as shown in FIG. 1 may be added to the wireless power transfer system 100 to form a multiple receiver system.

According to the standard of A4WP, the power transmitter operates at a fixed system frequency within a frequency band ranging from about 6.765 MHz to about 6.795 MHz (a 6.78 MHz nominal frequency). It should be noted that the power transmitter may operate at a frequency different from the one described above. The transmitter power amplifier converts dc power at its input to high frequency ac power having a frequency within the frequency band described above. The transmitter coil, coupled to the power amplifier through a resonant circuit (usually one or more capacitors), forms a transmitter resonant tank with the resonant circuit and generates a magnetic field at the system frequency. Through magnetic coupling, power is transferred to the receiver coil nearby. Likewise, the receiver coil and the resonant circuit of the power receiver form a receiver resonant tank.

Both the resonant circuit coupled to the receiver coil and the resonant circuit coupled to the transmitter coil may comprise one or more capacitors. The resonant frequency of the transmitter resonant tank and the resonant frequency of the receiver resonant tank are designed to be at the system frequency, which is determined by the switching frequency of the power amplifier.

In order to match the power capability and electrical parameters of the power amplifier and the resonant tank in the power transmitter, an impedance matching circuit may be placed between the power amplifier and the transmitter resonant circuit as shown in FIG. 1.

The rectifier in the power receiver converts the high frequency ac power from the receiver coil into dc power and delivers the dc power to the load through the receiver dc/dc converter. In the system shown in FIG. 1, for a given input voltage Vin sent to the power amplifier, the output voltage Vo at the rectifier may vary in a wide range due to a variety of factors such as the coupling coefficient changes between the transmitter and the receiver, load changes and the like.

In order to regulate the output voltage of the receiver within an acceptable range, the transmitter dc/dc converter may be employed to control the voltage sent to the power amplifier, and the receiver dc/dc converter may be employed to further regulate the voltage fed to the load. Because the input power is most likely from an ac/dc adapter plugged into an ac source, the transmitter dc/dc converter may be implemented as a dedicated dc/dc converter coupled to the ac/dc adapter. Alternatively, the transmitter dc/dc converter may be part of an ac/dc adapter. Similarly, the receiver dc/dc converter is usually implemented as a dc/dc converter. The load can be actual loads such as integrated circuits (ICs), a battery and the like. Alternatively, the load can be a downstream converter such as a battery charger, a dc/dc converter coupled to an actual load and the like.

The transmitter Bluetooth unit and the receiver Bluetooth unit form a Bluetooth communication subsystem providing a communication channel between the power receiver and the power transmitter. For example, the voltage control signal may be communicated between the transmitter and the receiver through the Bluetooth communication subsystem.

The wireless power transfer system 100 shown in FIG. 1 includes many power processing stages. Many components in the system shown in FIG. 1 may have high voltage/current stresses. It is desirable to have a wireless power transfer system having better efficiency and lower voltage/current stresses.

SUMMARY

In particular embodiments, a control apparatus and method may achieve better performance in wireless power transfer systems.

In accordance with an embodiment, an apparatus comprises a sense transistor having a gate and a source directly connected to a gate and a source of a power transistor of a resonant converter respectively, wherein the resonant converter comprises a primary side and a secondary side magnetically coupled to the primary side, a current sense and amplification circuit comprising an amplifier having inputs connected to a drain of the sense transistor and a drain of the power transistor respectively, an analog-to-digital converter connected to an output of the current sense and amplification circuit and a digital controller connected to an output of the analog-to-digital converter, wherein the digital controller is configured to modulate a variable capacitance network of the resonant converter based upon a current flowing through the sense transistor.

In accordance with another embodiment, a method comprises detecting a signal representing a current level at a power switch of a resonant converter with a sense switch coupled to the power switch and formed on a same semiconductor die, wherein the resonant converter comprises a primary side and a secondary side magnetically coupled to the primary side and adjusting a capacitance of a variable capacitance network of the resonant converter based upon the current level of the power switch.

In accordance with yet another embodiment, a method comprises providing a wireless power transfer system comprising a transmitter magnetically coupled to a receiver, wherein the transmitter comprises a power amplifier coupled to an input power source, a transmitter resonant tank comprising a transmitter variable capacitance network and a transmitter coil coupled to the transmitter resonant tank and the receiver comprises a receiver resonant tank comprising a receiver variable capacitance network and a first receiver coil coupled to the receiver resonant tank, sensing a current flowing through a power switch of the transmitter and a system parameter of the receiver and adjusting at least one capacitance value of the transmitter variable capacitance network and the receiver variable capacitance network based upon a corresponding sensed value through a controller.

An advantage of a preferred embodiment of the present invention is improving a wireless power transfer system's performance through adjusting at least one resonant component of the wireless power transfer system.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a control method and apparatus for improving a wireless power transfer system having a plurality of variable capacitance networks. The invention may also be applied, however, to a variety of other suitable power systems. Hereinafter, various embodiments will be explained in detail with reference to the accompanying drawings.

Figure 1:
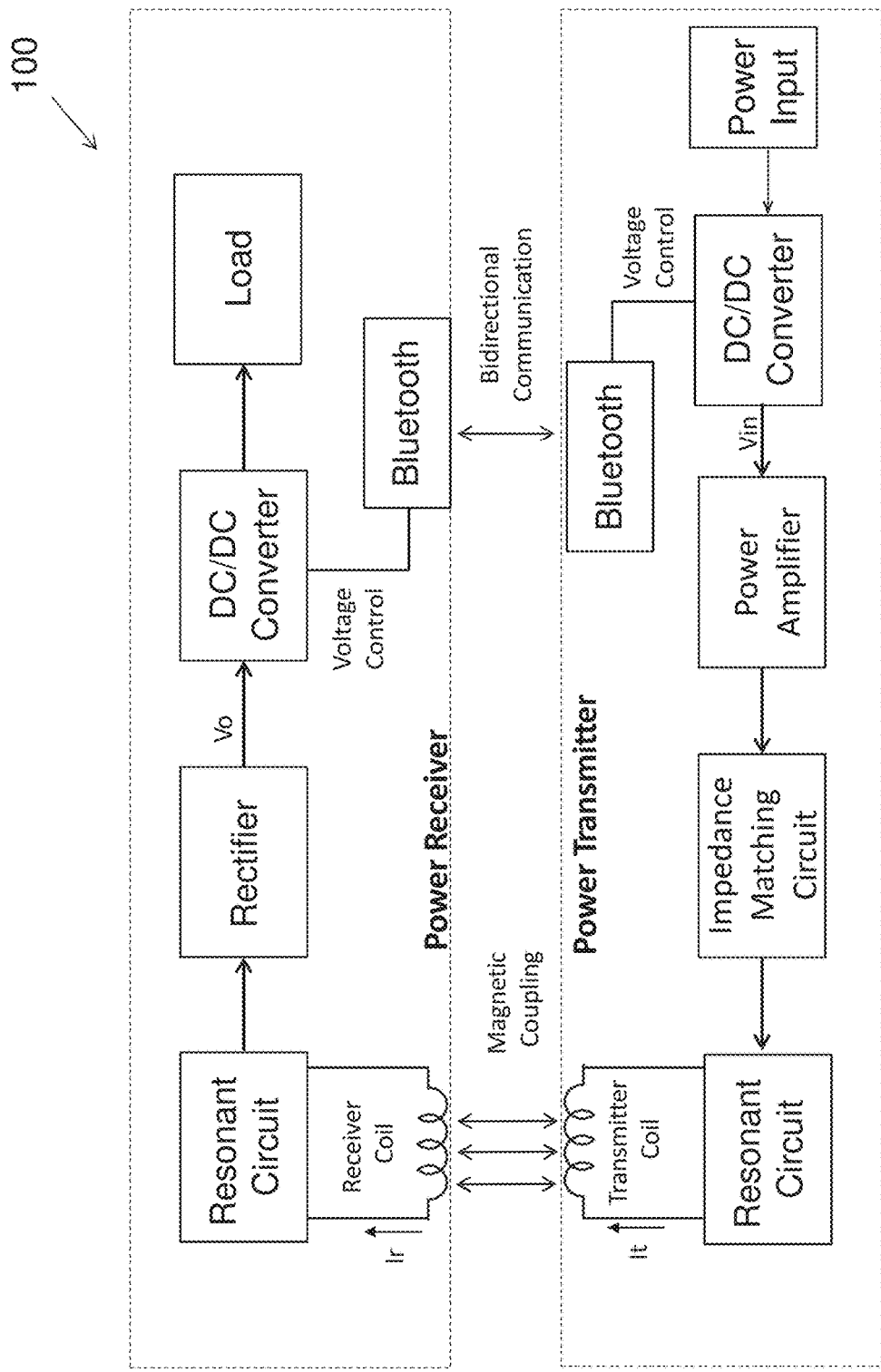
FIG. 1 illustrates a block diagram of a wireless power transfer system.
Figure 2:
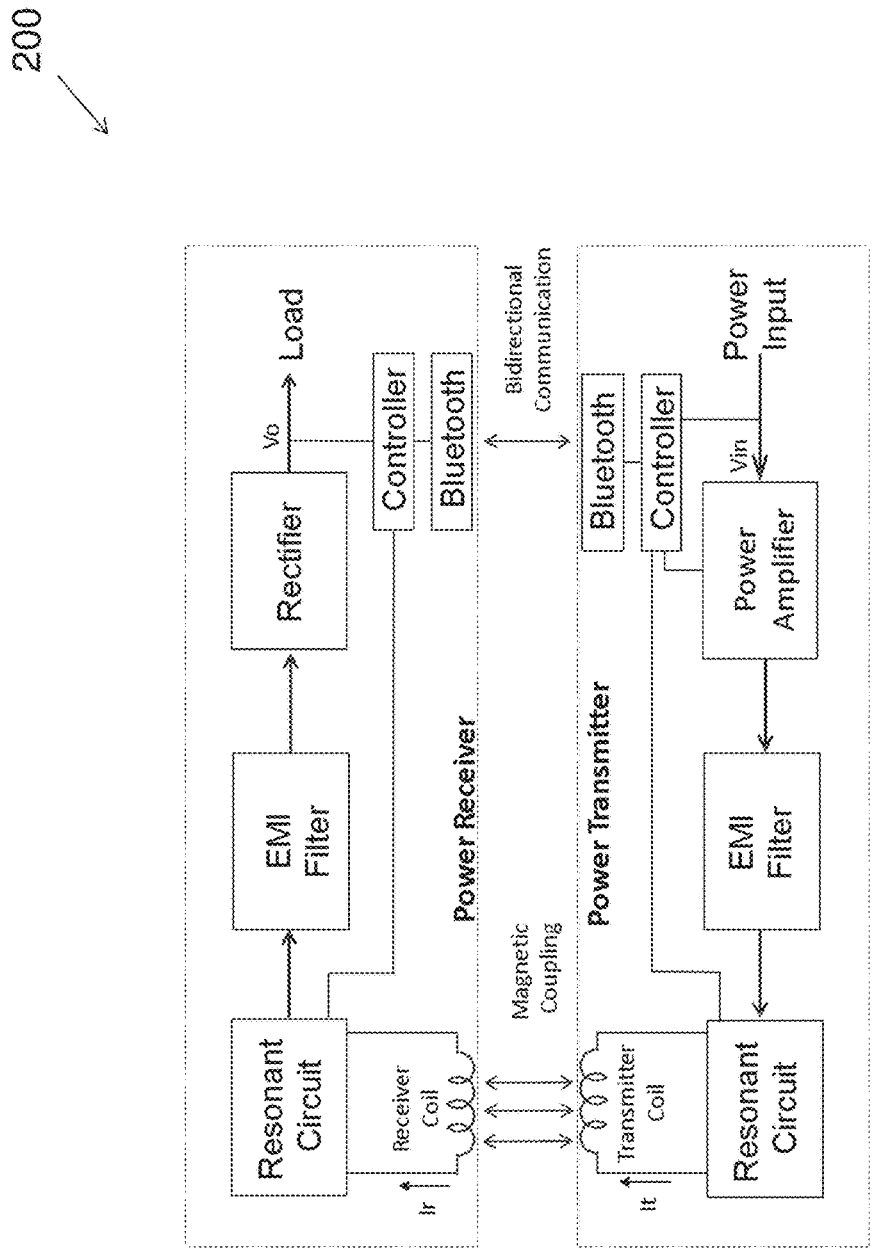
FIG. 2 illustrates a block diagram of a wireless power transfer system in accordance with various embodiments of the present disclosure.

FIG. 2 illustrates a block diagram of a wireless power transfer system in accordance with various embodiments of the present disclosure. The block diagram of the wireless power transfer system 200 shown in FIG. 2 is similar to that shown in FIG. 1 except that a first electromagnetic interference (EMI) filter is coupled between the power amplifier and the resonant circuit of the power transmitter, and a second EMI filter is coupled between the resonant circuit and the rectifier of the power receiver. For simplicity, only the first EMI filter and the second EMI filter are described in detail herein. It should be noted that an impedance matching circuit can be placed before or after the first or the second EMI filter. Furthermore, the impedance matching circuit may be part of the first or the second EMI filter.

In some applications, it's also feasible to have an EMI filter only in the power transmitter, or only in the power receiver. In some embodiments, an EMI filter shown in FIG. 2 may have different configurations such as low-pass filters, band-pass filters and other suitable topologies. In some embodiments, the EMI filters shown in FIG. 2 may comprise inductors and capacitors which form resonant circuits with one or more resonant frequencies. The detailed structures of the EMI filters will be described below with respect to FIG. 3.

Figure 3:
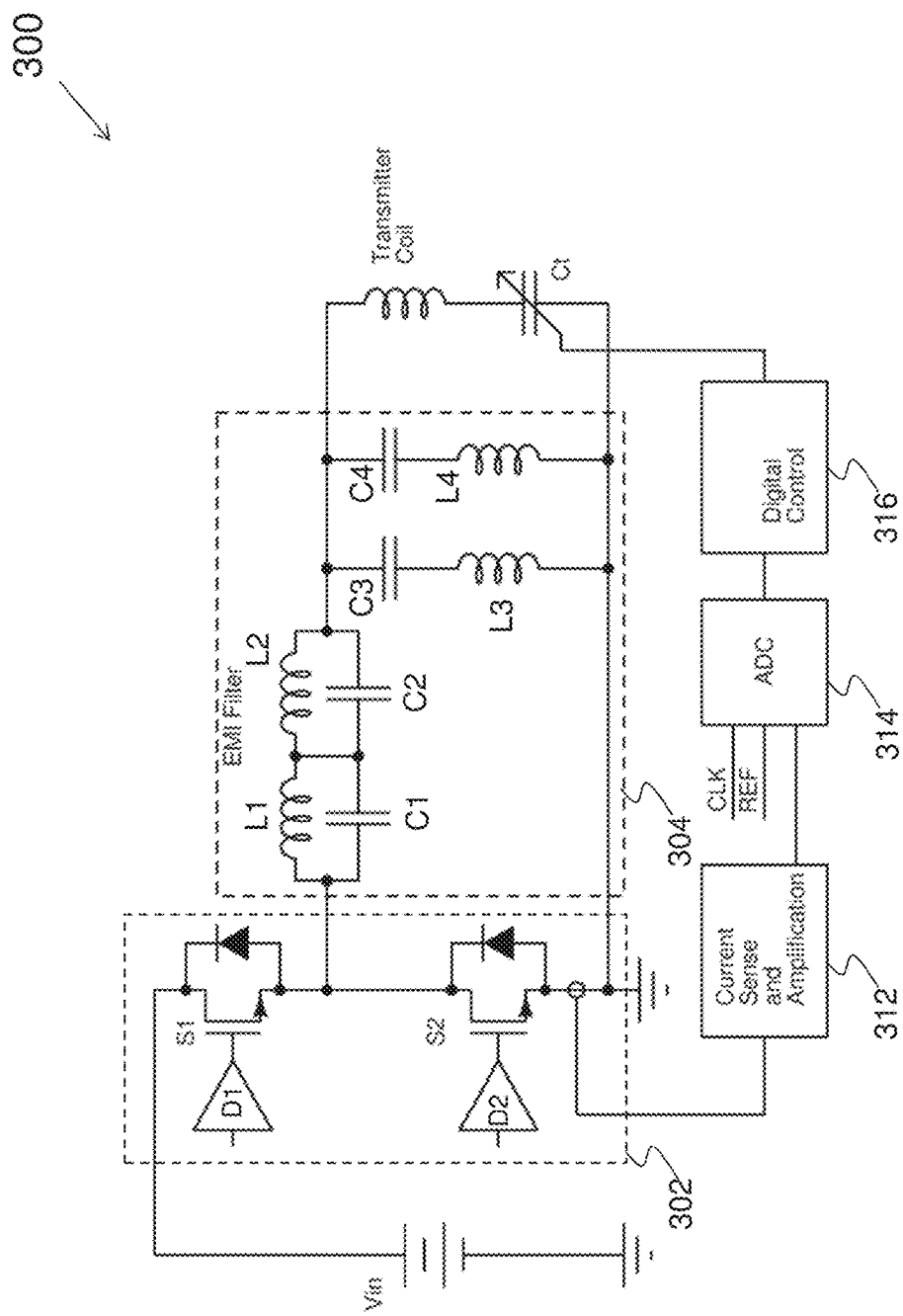
FIG. 3 illustrates a schematic diagram of an implementation of the transmitter side of the wireless power transfer system shown in FIG. 2 in accordance with various embodiments of the present disclosure.

FIG. 3 illustrates a schematic diagram of an implementation of the transmitter side of the wireless power transfer system shown in FIG. 2 in accordance with various embodiments of the present disclosure. The power transmitter 300 comprises a power amplifier 302, an EMI filter 304 comprising a plurality of capacitors and inductors, and a resonant circuit comprising variable capacitance capacitor Ct connected in series with the transmitter coil. Ct may be a variable capacitance network having multiple series and parallel capacitors. The detailed structure of Ct will be discussed later with respect to FIG. 7. Furthermore, one or more series capacitors (not shown) may be physically connected between the top terminal of the transmitter coil and the common node of L2, C2, C3 and C4. Such a capacitor configuration may help to reduce the common-mode voltage applied to the transmitter coil, thereby having better EMI performance. In some embodiments, another EMI filter (not shown) may be placed between the input source Vin and the power amplifier 302 if noise attenuation at the input side is necessary according to design needs.

In some embodiments, the power amplifier 302 is implemented as a class-D power amplifier as shown in FIG. 3. The power amplifier 302 comprises switches S1 and S2 connected in series between two terminals of Vin. The common node of switches S1 and S2 is connected to an input of the EMI filter 304. Throughout the description, switch S1 may be alternatively referred to as the high side switch S1; switch S2 may be alternatively referred to as the low side switch S2. It should be noted that the impedance matching circuit is not shown. Depending on different applications and design needs, the impedance matching circuit can be placed before or after the EMI filter 304.

The EMI filter 304 comprises inductors L1, L2, L3 and L4, and capacitors C1, C2, C3 and C4. As shown in FIG. 3, L1 and C1 are connected in parallel. L2 and C2 are connected in parallel. L3 and C3 are connected in series. L4 and C4 are connected in series. In some embodiments, L1 and C1 form a first harmonic trap circuit; L2 and C2 form a second harmonic trap circuit; L3 and C3 form a first harmonic notch circuit; L4 and C4 form a second harmonic notch circuit.

It should be noted that FIG. 3 illustrates only one capacitor is included in each harmonic suppression circuit. This is merely an example. Each harmonic suppression circuit shown in FIG. 3 may include hundreds of such capacitors. The number of capacitors illustrated herein is limited solely for the purpose of clearly illustrating the inventive aspects of the various embodiments. The present invention is not limited to any specific number of capacitors.

The resonant frequencies of the harmonic trap circuits and harmonic notch circuits can be set to the frequencies at which harmonics are to be suppressed. In some embodiments, a harmonic trap circuit and a corresponding harmonic notch circuit can have the same resonant frequency. For example, in FIG. 3, both the first harmonic trap circuit comprising L1 and C1, and the first harmonic notch circuit comprising of L3 and C3 can be designed for suppressing the third harmonic. Since the third harmonic may be a dominant harmonic in a wireless power transfer system, it may need more filtering than other high order harmonics. Using both the first harmonic trap circuit and the first harmonic notch circuit to suppress the third harmonic helps the EMI filter achieve better harmonic suppression.

In some embodiments, the second harmonic trap circuit comprising L2 and C2 can be designed for suppressing the fifth harmonic. The second harmonic notch circuit comprising of L4 and C4 can be designed for suppressing the seventh harmonic. As such, the third, fifth and seventh harmonic currents are reduced significantly, and other higher order harmonics can also be suppressed. As a result, the current in the transmitter coil may be substantially sinusoidal.

It should be noted that, in order to achieve better system performance, it is desirable to have a low inductance path in any harmonic trap circuit shown in FIG. 3 and a low capacitance path in any harmonic notch circuit shown in FIG. 3. Such a configuration helps to reduce the impact on the performance of the wireless power transfer system at the fundamental frequency. It should be noted that the fundamental frequency may be equal to or approximately equal to the system frequency of the wireless power transfer system.

The transmitter may further comprise a current sense and amplification apparatus 312, an analog-to-digital converter 314 and a digital controller 316 connected in cascade as shown in FIG. 3. The current sense and amplification apparatus 312 may comprise a sense transistor, a sample/hold circuit, a suitable amplifier and/or filters. The detailed circuit of the current sense and amplification apparatus 312 will be described below with respect to FIG. 4. The digital controller 316 is capable of adjusting the capacitance of Ct. Alternatively, the impedance adjustment function may be implemented as a separate functional unit.

To achieve better system performance, the turn-off of the current flowing through the switch (e.g., S2) must fall into an appropriate range. Within this range, the turn-off current level is controlled accordingly. Such a turn-off current level helps the main power switches S1 and S2 achieve zero voltage switching (ZVS) or operate in a mode close to ZVS. The value of the turn-off current level described above may vary depending on different operating modes, different power devices, different input voltages, and the dead-time between turn off of one switch and turn on of the other switch, and may be adjusted dynamically during a transmitter operation to achieve better system performance. As such, the current sense and amplification apparatus 312 for monitoring the turn-off current of the switches and the digital controller 316 for controlling the turn-off current within an appropriate range or at an appropriate level are crucial to achieve high performance.

The switches S1 and S2 may operate at a high switching frequency such as 6.78 MHz. At such a high frequency (e.g., 6.78 MHz), it is hard and expensive to achieve accurate current sensing because parasitic parameters may affect high precision measurement. For example, even 1 nH parasitic inductance in a sense circuit may contaminate the sensed current signal. Furthermore, a low inductance current sensing resistor is bulky and expensive. To sense this high frequency resonant current (e.g., 6.78 MHz), It is desirable to have an integrated current sensing circuit to measure the current flowing through the switches (e.g., switch S2).

Figure 4:
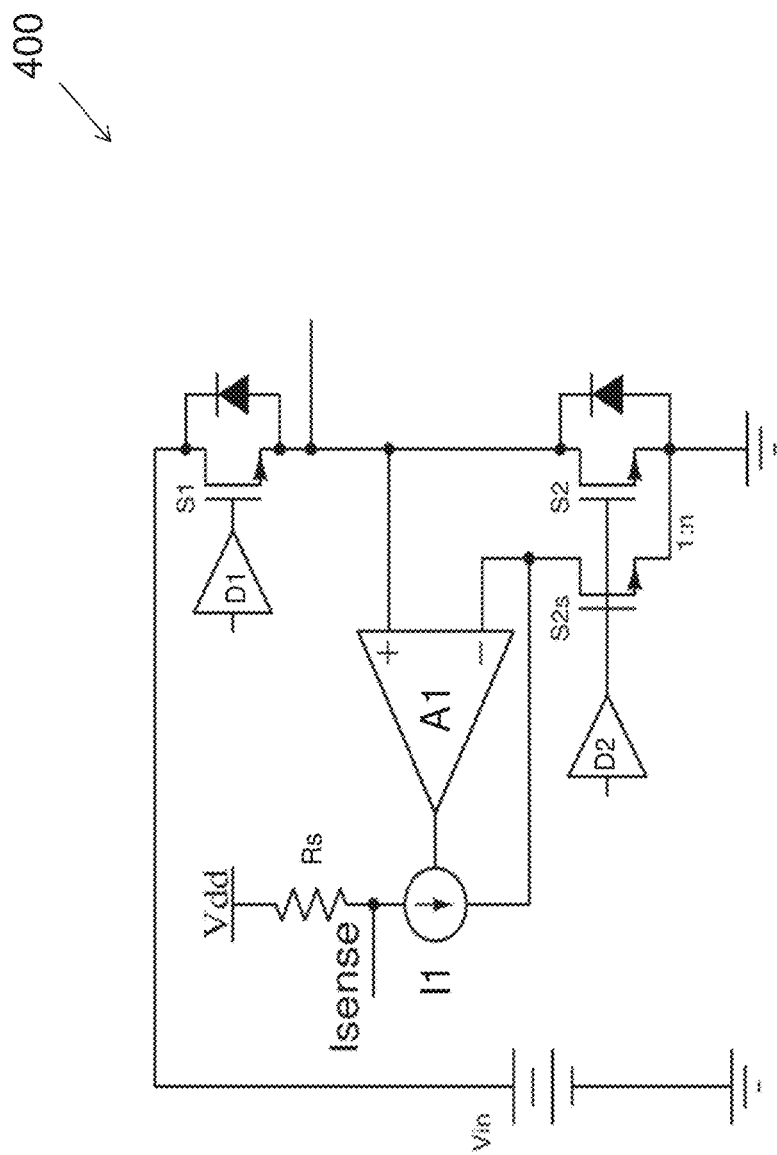
FIG. 4 illustrates a schematic diagram of an integrated current sensing apparatus in accordance with various embodiments of the present application.

FIG. 4 illustrates a schematic diagram of an integrated current sensing apparatus in accordance with various embodiments of the present application. The integrated current sensing apparatus 400 includes a sense transistor S2s, an amplifier A1, a current source I1 and a resistor Rs. As shown in FIG. 4, the high side switch S1 and the low side switch S2 are connected in series between two output terminals of the input dc power source Vin. It should be noted that either the current flowing through S1, the current flowing through S2 or both can be sensed. It should further be noted that in the present disclosure, sensing the current flowing through S2 is described in detail as an example. The current sensing technique is applicable to S1 as well as switches at the receiver.

In some embodiments, both the sense transistor S2s and the low side switch S2 are implemented as n-type transistors. The sources of S2s and S2 are directly connected together and further connected to ground. The gates of S2s and S2 may be directly connected together and further connected to the output of the low side driver D2. As a result, both switches S2 and S2s are turned on or off at the same time. The drain of S2 is coupled to a first input of the amplifier A1. The drain of S2s is connected to a second input of the amplifier A1 and the current source I1.

The output of the amplifier A1 is coupled to the current source I1. As shown in FIG. 4, the amplifier A1 is employed to regulate the drain voltage of S2s to be equal to the drain voltage of S2. Furthermore, the amplifier A1 is used to control the current source I1 so that the current source I1 generates a current proportional to the current flowing through S2. The resistor Rs is employed to convert the sensed current into a voltage signal I sense.

The sense transistor S2s is employed to sense the current flowing through the low side switch S2. According to some embodiments, S2s is designed to have a similar performance as S2. Furthermore, S2s and S2 are fabricated on a same semiconductor die. S2s and S2 may form a current mirror. As a result, there may be good matching between the main power transistor S2 and the sense transistor S2s. In order to efficiently sense the current flowing through the low side switch S2, a current scaling technique is used to design the sense transistor S2s. More particularly, the size (e.g., the cannel width/length ratio) of the sense transistor S2s has been reduced by a scaling factor n with respect to the size of the low side switch S2, where n corresponds to an integer greater than 1. In some embodiments, n is in a range from about 100 to about 1 million.

It should be noted that, in order to improve the sensing speed and accuracy, the current sensing device S2s and the amplifier A1 are integrated into a same silicon chip. Furthermore, the circuit shown in FIG. 4 is able to achieve cycle by cycle current sensing. It should further be noted that a plurality of circuits, each of which has the same structure as the current sense apparatus 400 shown in FIG. 4 may be used to sense the current of the transmitter. The plurality of circuits helps to achieve better current sensing accuracy.

I1 can be further processed to generate other current and voltage signals used by the system. For example, a peak current signal may be obtained by applying a peak-detect circuit with a suitable filter to I1 or a signal representing I1. Such peak current information can be used to assess the current level in the transmitter, or for system control and/or optimization processes. In addition, although the current sensing circuit shown in FIG. 4 is designed for sensing the low side switch S2, it can be applied to the high side switch S1. Furthermore, the current sensing circuit shown in FIG. 4 can be used to sense the currents flowing in S1 and S2. Moreover, suitable techniques such as component matching, trimming, compensation and the like can also be used to achieve better current sensing.

Figure 5:
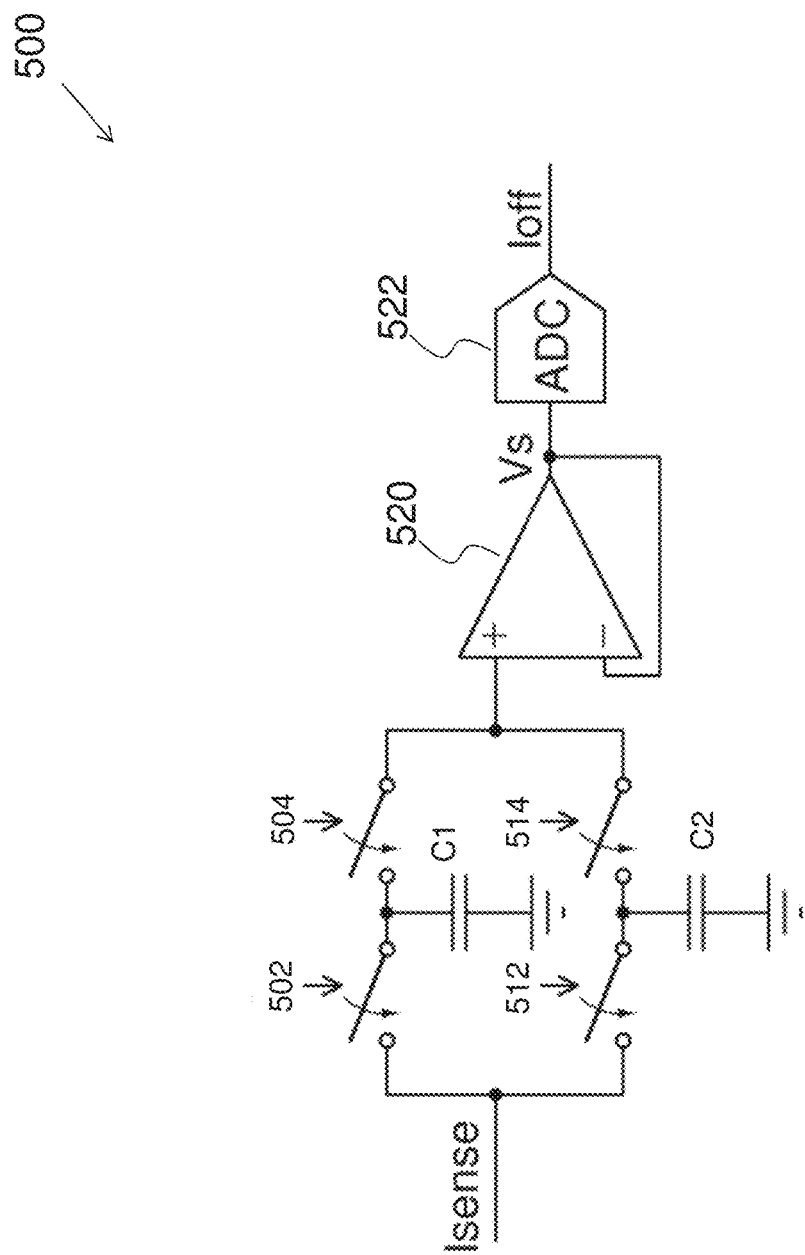
FIG. 5 illustrates a schematic diagram of a sample and hold circuit in accordance with various embodiments of the present application.

FIG. 5 illustrates a schematic diagram of a sample and hold circuit in accordance with various embodiments of the present application. In a fixed switching frequency system such as A4WP wireless power systems, the turn-off time is predetermined. With a sample and hold circuit timed in synchronization with the transmitter switches S1 and/or S2, the switch current can be sampled slightly before the switch is turned off. The sensed signal is then fed into an ADC and converted into a digital signal.

FIG. 5 shows an implementation of a sample and hold circuit 500. The sample and hold circuit 500 includes four switches, namely 502, 504, 512 and 514, and two capacitors C1 and C2. The signal Isense is from a sense transistor such as the Isense signal shown in FIG. 4.

As shown in FIG. 5, the switches 502, 504 and capacitor C1 are used to sense a first point of Isense. The switches 512, 514 and capacitor C2 are used to sense a second point of Isense. The sensed current values are fed into a non-inverting input of a buffer 520. The output of the buffer 520 is connected to an input of an ADC 522 in which the sensed current value is converted into a digital signal Ioff.

Figure 6:
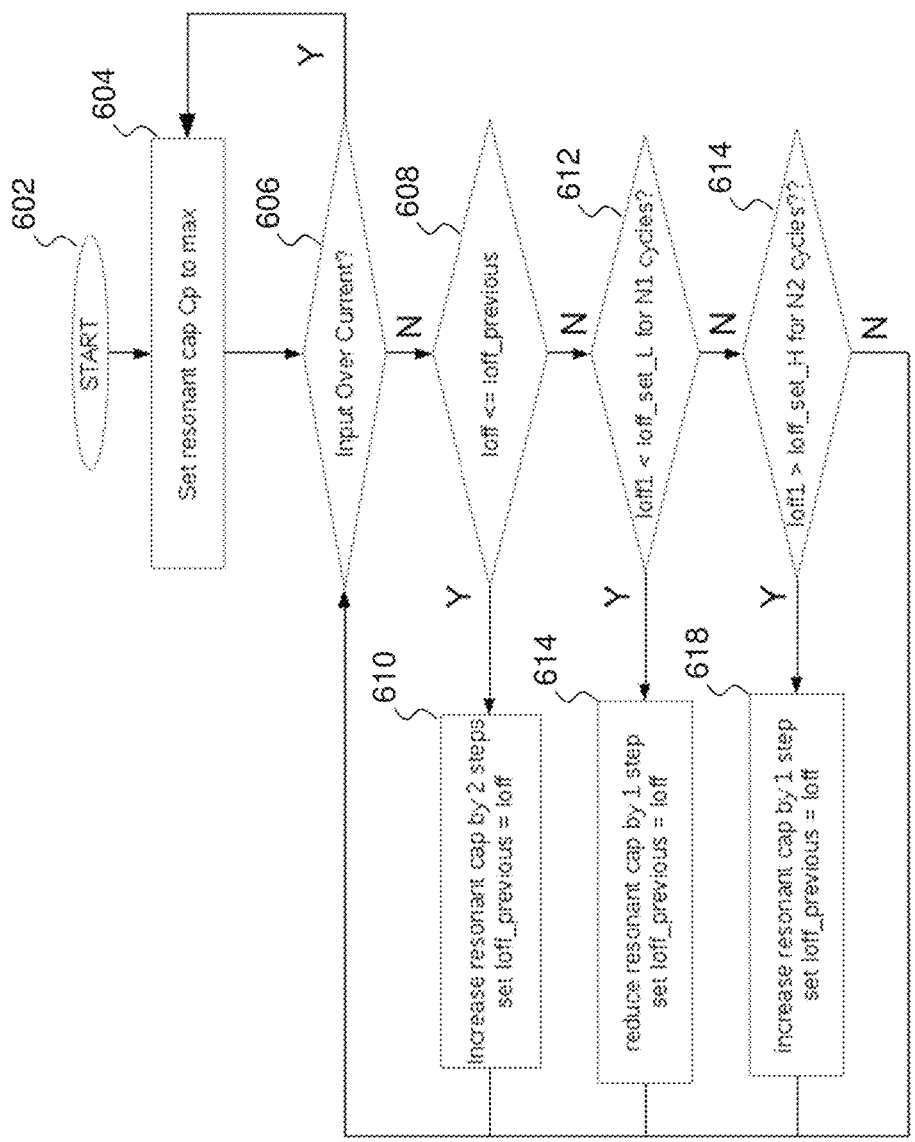
FIG. 6 illustrates a flow chart of a control method for adjusting the variable capacitance network of the transmitter of a wireless power transfer system in accordance with various embodiments of the present application.

After the information of the turn off current has been converted into the digital signal Ioff, the digital control circuit such as a digital controller uses the control method shown in FIG. 6 to adjust the value of the capacitance of the variable capacitance network of the transmitter.

FIG. 6 illustrates a flow chart of a control method for adjusting the variable capacitance network of the transmitter of a wireless power transfer system in accordance with various embodiments of the present application. This flowchart shown in FIG. 6 is merely an example, which should not unduly limit the scope of the claims. One of ordinary skill in the art would recognize many variations, alternatives, and modifications. For example, various steps illustrated in FIG. 6 may be added, removed, replaced, rearranged and repeated.

The method 600 starts at step 602. After the method 600 starts, at step 604, the resonant capacitor Ct shown in FIG. 3 is set to its maximum value, which is a predetermined value depending on different applications and design needs. At step 606, if the current flowing through the transmitter exceeds a chosen threshold value (e.g., an overcurrent threshold), the method 600 returns to step 604 from step 606. Also at step 606, if the current flowing through the transmitter does not exceeds the chosen threshold value, the method 600 proceeds to step 608 as shown in FIG. 6.

The current sense circuit in FIG. 4 is used to sense the current flowing through S2. In some embodiments, the sample and hold circuit in FIG. 5 is used to sample the current value just before S2 is turned off. At step 608, the sensed current of S2 is compared with the sensed current obtained from the previous cycle. If the sensed current is less than or equal to the sensed current obtained from the previous cycle, the method 600 proceeds to step 610, where the method 600 increases the resonant capacitor by a preset value such as two steps as shown in FIG. 6 and replaces the sensed current obtained from the previous cycle with the current sensed in the present cycle, and then returns to step 606. Also at step 608, if the sensed current is greater than the sensed current obtained from the previous cycle, the method 600 proceeds to step 612.

At step 612, the sensed current of S2 is compared with a first sensed current threshold, which indicates whether the current flowing through the transmitter is too small. If, during N1 cycles, the sensed current is less than the first sensed current threshold, the method 600 proceeds to step 614, where the method 600 reduces the resonant capacitor by a preset value such as one step as shown in FIG. 6 and replaces the sensed current obtained from the previous cycle with the current sensed in the present cycle, and then returns to step 606. Also at step 612, if the sensed current is greater than or equal to the first sensed current threshold, the method 600 proceeds to step 614.

At step 614, the sensed current of S2 is compared with a second sensed current threshold, which indicates whether the current flowing through the transmitter is too large. If, during N2 cycles, the sensed current is greater than the second sensed current threshold, the method 600 proceeds to step 618, where the method 600 increases the resonant capacitor by a preset value such as one step as shown in FIG. 6 and replaces the sensed current obtained from the previous cycle with the current sensed in the present cycle, and then returns to step 606. Also at step 614, if the sensed current is less than or equal to the second sensed current threshold, the method 600 returns to step 606 from step 614.

It should be noted N1, N2, the first sensed current threshold, the second sensed current threshold and the steps of adjusting the variable capacitance network are predetermined values. Depending on design needs and different applications, these predetermined values may vary accordingly. In addition, the predetermined values may be dynamically adjusted during an operation of the transmitter.

Please note that the thresholds shown in FIG. 6 may be a value or a range corresponding to an appropriate turn-off current. The thresholds may vary depending on one or more system variables such as a temperature in a device (e.g., switch S2), the input voltage of the transmitter, the peak current information in a switch (e.g., switch S2) for improving the system performance.

Figure 7:
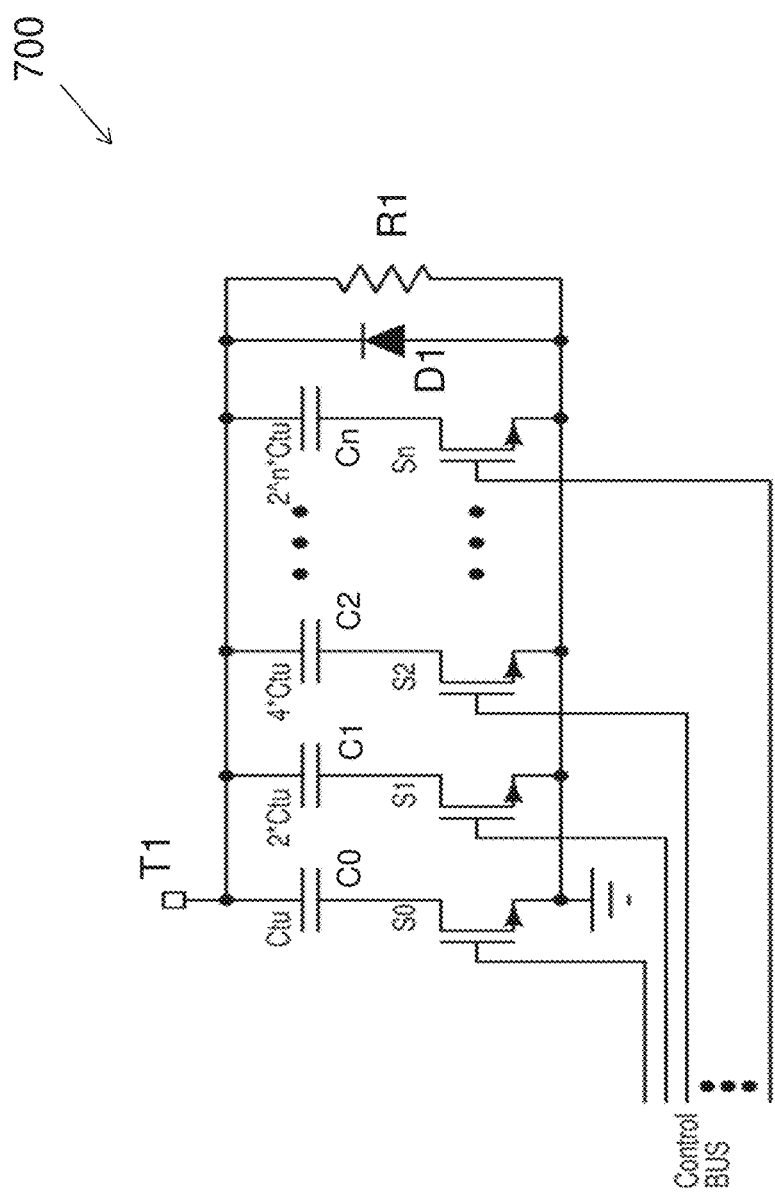
FIG. 7 illustrates an implementation of a variable resonant capacitance network in accordance with various embodiments of the present application.

FIG. 7 illustrates an implementation of a variable resonant capacitance network in accordance with various embodiments of the present application. The variable resonant capacitance network 700 comprises a diode D1, a resistor R1 connected in parallel with the diode D1 and a plurality of capacitor-switch networks connected in parallel with the diode D1 and resistor R1.

As shown in FIG. 7, there may be n capacitor-switch networks, where n is a predetermined integer no less than 1. A first capacitor-switch network comprises a capacitor C0 and a switch S0 connected in series and further connected in parallel with R1. Likewise, a second capacitor-switch network comprises a capacitor C1 and a switch S1 connected in series and further connected in parallel with R1; a third capacitor-switch network comprises a capacitor C2 and a switch S2 connected in series and further connected in parallel with R1; an nth capacitor-switch network comprises a capacitor Cn and a switch Sn connected in series and further connected in parallel with R1.

As shown in FIG. 7, the gates of the switches S0, S1, S2, . . . , Sn are controlled by control signals sent from a controller (not shown) through a control bus. In some embodiments, the controller may employ the control method shown in FIG. 6. Furthermore, in some embodiments, as shown in FIG. 7, the capacitance values of the capacitors from left to right are in binary increments.

By controlling the turn-on and turn-off of the switches S0, S1, . . . , Sn, the total capacitance of the variable capacitance network 700 may vary accordingly. The capacitance change may help to adjust the resonant frequency of the transmitter circuit so as to achieve the desired system performance.

The desired system performance ensures a better soft switching condition and a high efficiency operation on the transmitter side. By sensing a voltage across the variable capacitor network 700, or a current in the transmitter coil or in the switches of the power amplifier, the switches S0, S1, . . . , Sn can be turned on or turned off when such a voltage or current is at their respective lower points, preferably close to zero.

Furthermore, using the variable capacitor network disclosed in U.S. patent application Ser. No. 14/834,289, the lowest voltage across this variable capacitor network (equivalently across the diode in FIG. 7) and a zero-crossing point of the transmitter coil current may occur at the same time. A voltage valley detection circuit determines the lowest point of such voltage and triggers the turn-on and/or turn-off signals of the switches S0, S1, . . . , Sn.

In sum, the turn-on and turn-off of the switches shown in FIG. 7 occur when the voltages across their respective capacitors reach a value approximately equal to zero. As such, all switches shown in FIG. 7 can be turned on and off with zero or low switching stresses, thereby having low power losses, low switching noise and reliable operation. Such switches can be designed by taking advantage of these lower stress operating conditions so as to achieve good performance as well as lower material costs.

Figure 8:
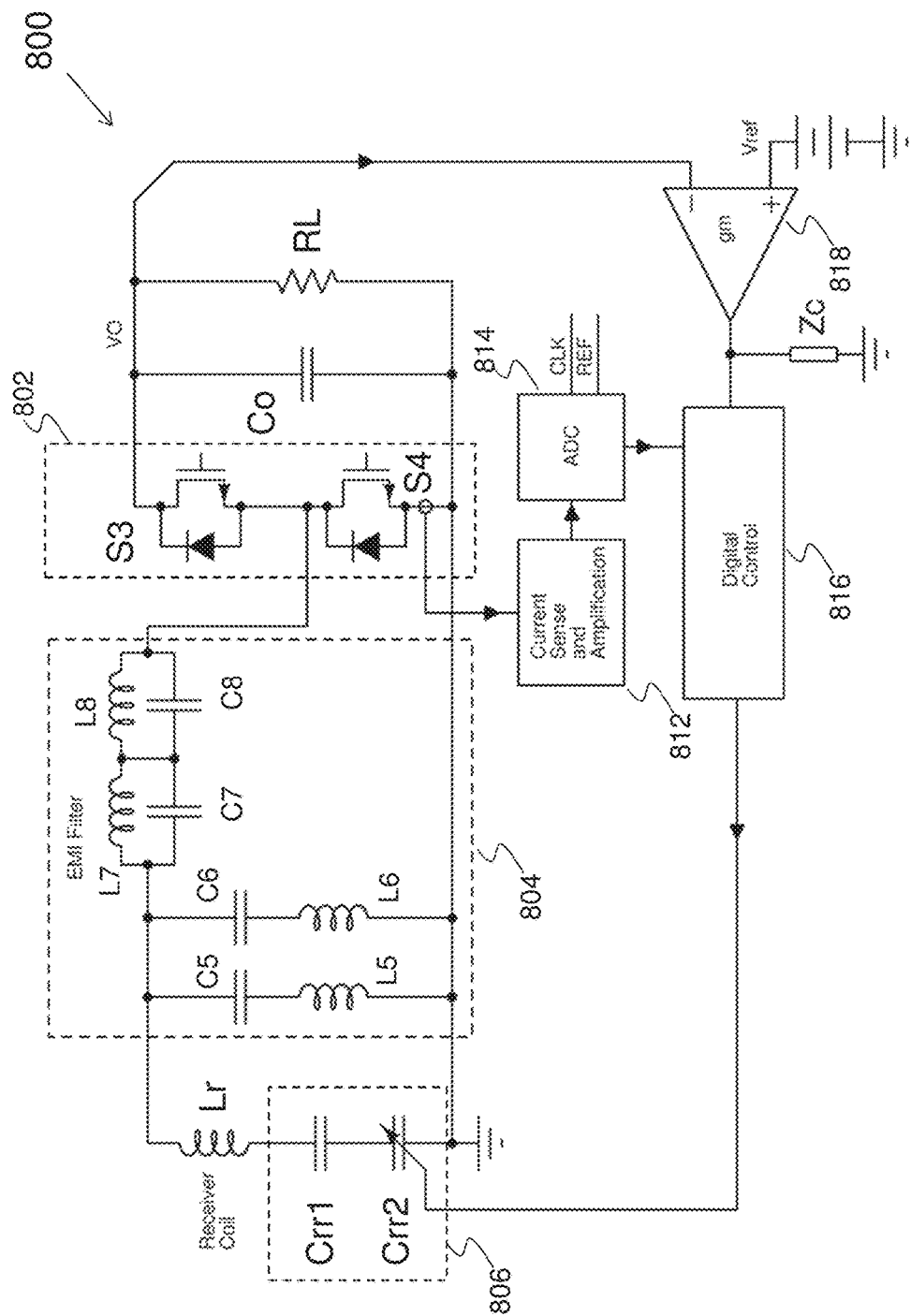
FIG. 8 illustrates a schematic diagram of an implementation of the receiver side of the wireless power transfer system shown in FIG. 2 in accordance with various embodiments of the present disclosure.

FIG. 8 illustrates a schematic diagram of an implementation of the receiver side of the wireless power transfer system shown in FIG. 2 in accordance with various embodiments of the present disclosure. The power receiver 800 comprises a rectifier 802, a receiver EMI filter 804, a receiver resonant circuit 806 connected between a load RL and a receiver coil Lr. The optional receiver EMI filter 804 may comprise inductors L5, L6, L7 and L8, and capacitors C5, C6, C7 and C8. As shown in FIGS. 8, L5 and C5 are connected in series. L6 and C6 are connected in series. L7 and C7 are connected in parallel. L8 and C8 are connected in parallel.

In some embodiments, L5 and C5 form a first harmonic notch circuit in the receiver EMI filter 804; L6 and C6 form a second harmonic notch circuit in the receiver EMI filter 804; L7 and C7 form a first harmonic trap circuit in the receiver EMI filter 804; L8 and C8 form a second harmonic trap circuit in the receiver EMI filter 804.

The rectifier 802 comprises switches S3 and S4. In alternative embodiments, S3 and S4 can be replaced by two diodes. Furthermore, S3 and S4 may be controlled to emulate diode functions so as to form a high-efficiency diode rectifier. Furthermore, the rectifier 802 may be formed by other types of controllable devices such as bipolar junction transistor (BJT) devices, super junction transistor (SJT) devices, insulated gate bipolar transistor (IGBT) devices, gallium nitride (GaN) based power devices and/or the like.

The detailed operation and structure of the rectifier 802 are well known in the art, and hence are not discussed herein.

The receiver resonant circuit 806 comprises a first resonant capacitor Crr1 and a second resonant capacitor Crr2. In some embodiments, the first resonant capacitor Crr1 is a capacitor having a fixed capacitance value. Crr2 can be implemented as a capacitor having variable capacitance. For example, Crr2 may be implemented as a variable capacitance network as described in U.S. patent application Ser. No. 14/177,049. Alternatively, Crr2 may be implemented as a variable capacitance network shown in FIG. 7. It should be noted that, in some embodiments, Crr1 is optional. In addition, Crr1 may be moved to a place between the top terminal of Lr and the common node of L7, C5, C6 and C7.

The capacitance of Crr2 can be adjusted by controlling the gate signals applied to the switches S0, S1, . . . , Sn in the variable capacitance network shown in FIG. 7 according to different system operating conditions. The arrangement of the capacitors and switches in the variable capacitance network is designed such that the capacitor and switch networks are capable of generating a large number of capacitance variation steps, which offer an almost continuous variation of the capacitance of Crr2 in a wide range.

The load RL can be actual loads such as integrated circuits, a battery and the like. Alternatively, the load can be a downstream converter such as a battery charger, a dc/dc converter coupled to an actual load and the like.

As shown in FIG. 8, the current flowing through S4 can be sensed by a current sense and amplification circuit 812. In some embodiments, the current sense and amplification circuit 812 may include a sense circuit and a sample and hold circuit. The sense circuit and the sample and hold circuit of the receiver side are similar to the sense circuit and the sample and hold circuit shown in FIGS. 4-5 respectively, and hence is not discussed herein again to avoid repetition.

The output voltage Vo is fed into an inverting input of an amplifier 818. At the amplifier 818, the sensed output voltage Vo is compared with a predetermined reference Vref. The output of the amplifier 818 is sent to a digital controller 816. A compensation impedance Zc may be coupled to the output of the amplifier 818.

The digital controller 816 also receives the sensed current signal from the current sense and amplification circuit 812 through an A/D converter 814. The A/D converter 814 generates a digital signal suitable for the digital controller 816 based upon the sensed current from the current sense and amplification circuit 812, a clock signal and a predetermined reference as shown in FIG. 8.

Based upon the sensed current signal from the A/D converter 814 and the output voltage information from the amplifier 818, the digital controller 816 generates a digital command to control the variable capacitor Crr2 as shown in FIG. 8. By adjusting the value of the variable capacitor Crr2, system parameters such as the output voltage Vo, the output current Io and the output power Po may be regulated accordingly.

It should be noted that, for the receiver side, the techniques shown in FIGS. 3-7 can also be implemented, and purpose of the capacitor modulation shown in FIGS. 3-7 can be used to regulate a system parameter such as the output voltage Vo, the output current Io the output power Po and/or any combinations thereof. It should be noted that regulating the output voltage Vo is discussed in detail in this disclosure. This is merely an example. The control mechanism of regulating the output voltage Vo can be used to regulate other system parameters.

Figure 9:
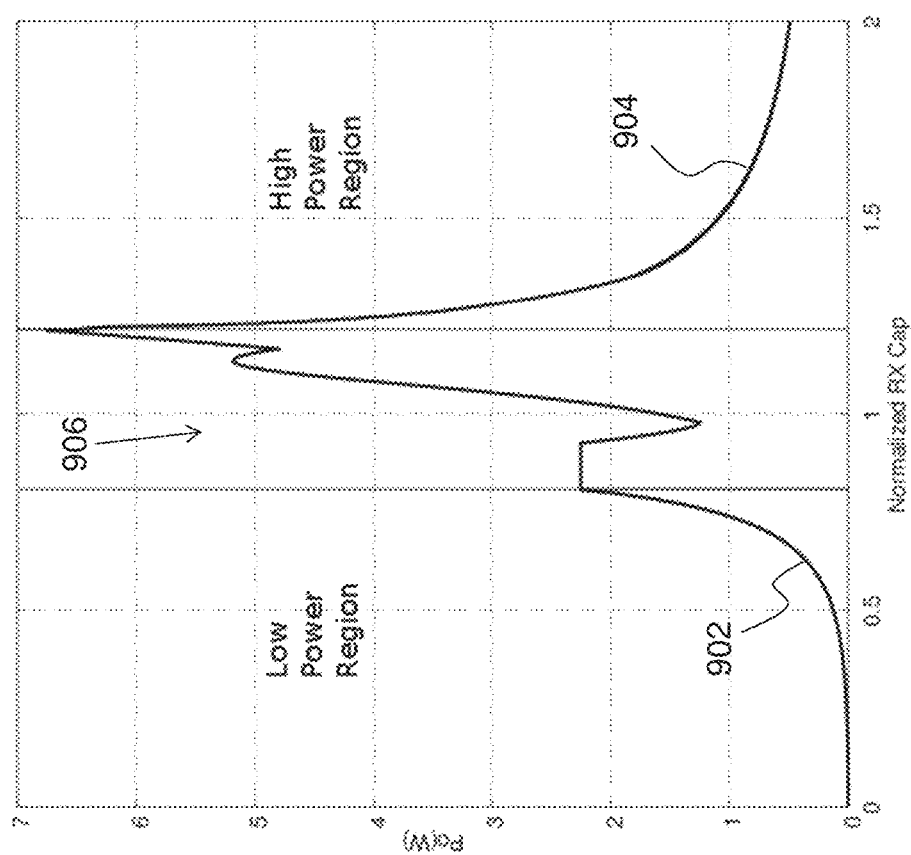
FIG. 9 illustrates an output power versus resonant capacitance curve in accordance with various embodiments of the present disclosure.

FIG. 9 illustrates an output power versus resonant capacitance curve in accordance with various embodiments of the present disclosure. The horizontal axis represents the capacitance of the receiver's variable capacitor. The vertical axis represents the output power of the receiver. The characteristic curve shown in FIG. 9 can be divided into three regions, namely a low power region 902, a high power region 904 and a non-monotonic region 906 between the low power region 902 and the high power region 904.

In a wireless power transfer system, when the switching frequency of the receiver is equal to the resonant frequency of the receiver tank, the corresponding capacitance is defined as Csc. The lower power region is the region shown in FIG. 9 in which the capacitance of the receiver side resonant capacitance Crr is less than the capacitance Csc. In this region, when the value of Cs is reduced, the output power of the receiver drops. As a result, the max output power is limited below a value (e.g., about 2 W shown in FIG. 9).

On the other hand, when Crr is large enough, the receiver side enters the high power region 904. In this region, the output power drops with the increase of the value of Crr. The region between the low power region 902 and the high power region 904 has a non-monotonic characteristic curve, which is complex and hard to predict in consideration with other parameters such as coupling, load changes and the like.

In operation, the control system should prevent the receiver from entering into the non-monotonic region 906. This requires a proper control mechanism or algorithm. In order to get a high output power while limiting the output voltage when the load becomes lighter, the system may operate in the high power region when the load is heavy. In contrast, the system may move into the low power region 902 when load becomes light. By this way, the output voltage Vo can be regulated with good accuracy in a wide load variation range.

Due to the parasitic capacitance related to the power devices and other relevant circuits, the lowest value of Crr may be still too high for an ultra-light load condition. To fix this problem, a skip mode is proposed for controlling the receiver side synchronous rectifier's operation. The skip mode of the receiver side synchronous rectifier will be described in detail below with respect to FIG. 11.

Figure 10:
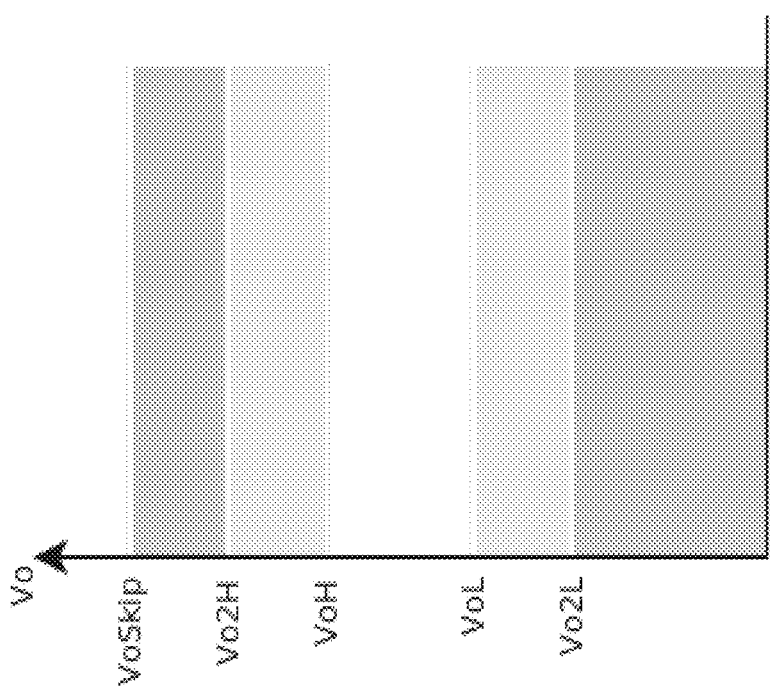
FIG. 10 illustrates a plurality of output voltage thresholds in accordance with various embodiments of the present disclosure.

FIG. 10 illustrates a plurality of output voltage thresholds in accordance with various embodiments of the present disclosure. The output voltage Vo has a variety of thresholds as shown in FIG. 10. Vo2L, VoL, VoH, Vo2H and VoSkip are predetermined values. The desired output voltage is between VoL and VoH. In some embodiments, VoL and VoH form a normal output voltage range. Please note that these thresholds may be changed dynamically during the operation of the receiver. When the output voltage is higher than VoSkip, the receiver side synchronous rectifier may enter into the skip mode. The detailed operation of the skip mode will be described below with respect to FIG. 11.

Figure 11:
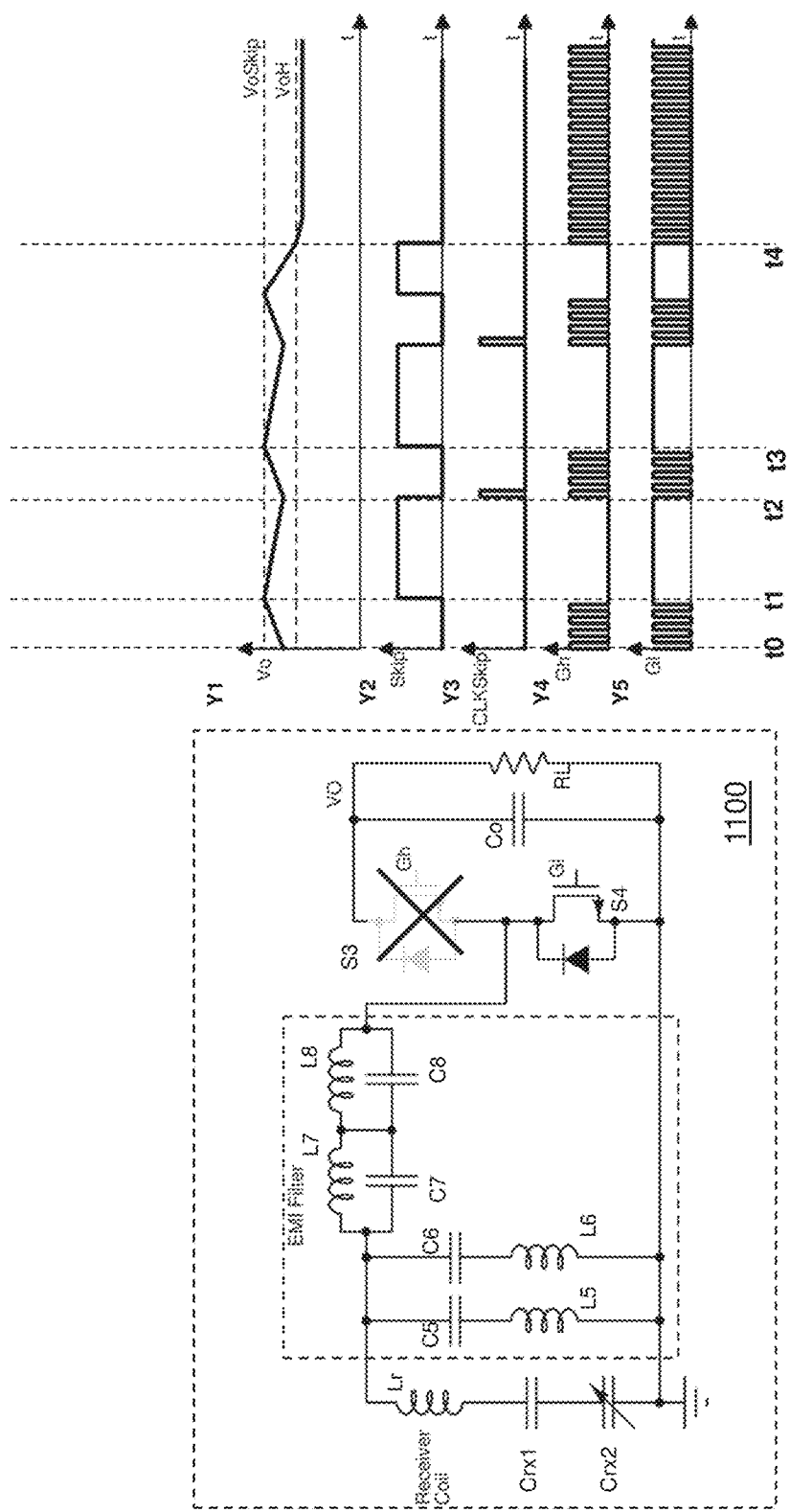
FIG. 11 illustrates the operation of the skip mode in accordance with various embodiments of the present disclosure.

FIG. 11 illustrates the operation of the skip mode in accordance with various embodiments of the present disclosure. The structure of the receiver 1100 is similar to that shown in FIG. 8, and hence is not discussed again.

The horizontal axis of FIG. 11 represents intervals of time. There are five vertical axes. The first vertical axis Y1 represents the output voltage Vo of the receiver 1100. The second vertical axis Y2 represents a skip mode signal. The third vertical axis Y3 represents a skip control signal for stopping the skip mode operation, which may be used to adjust the skip mode operation's frequency. The fourth vertical axis Y4 represents the gate drive signal of switch S3. The fifth vertical axis Y5 represents the gate drive signal of switch S4.

At t0, both S3 and S4 are driven in a complimentary manner, and the receiver is in a normal operation. In an ultra-light load condition, the output voltage Vo keeps going up as shown in FIG. 11. At t1, the output voltage Vo reaches the skip mode threshold. This triggers the skip mode operation. The skip mode signal changes from logic low (0 state) to high (1 state) where the logic high state indicates a skip mode.

During the skip mode from t1 to t2, S3 is always off and S4 is always on (or vice versa) as indicated by the gate drive signals Gh and Gl, respectively. Since S3 is always off as shown in FIG. 11, the output capacitor Co is discharged and the output voltage Vo starts to drop as shown in FIG. 11. The length of the logic high state is controlled by the skip control signal.

At t2, the skip control signal changes from logic low to high. Such a logic state change disables the skip mode. As a result, both S3 and S4 are driven in a complimentary manner from t2 to t3, and the receiver 1100 operates in the normal operation again. At t3, the output voltage Vo reaches the skip mode threshold again and the receiver 1100 enters the skip mode.

From t3 to t4, the receiver 1100 operates back and forth between the skip mode and the synchronous mode. At t4, when the output voltage has fallen below the threshold VoH, the receiver 1100 leaves the skip mode and enters the synchronous mode.

It should be noted that while FIG. 11 shows, in the skip mode, the low side switch of the synchronous rectifier can be held on while the high side switch is turned off, this is merely an example. In an alternative embodiment, the high side switch of the synchronous rectifier can be held on while the low side switch is kept off. Under either condition described above, no energy is transferred to the output of the receiver 1100. As a result, the output voltage may drop to a normal range even with a very light load.

As described above, the frequency of the skip mode can be controlled by the skip control signal. One advantageous feature of having this skip control signal is adjusting the frequency of the skip mode helps to prevent EMI problems caused by the skip mode from affecting the operation of the receiver 1100. For example, by limiting the frequency of the skip mode, EMI noise induced by the skip mode is mostly within the side band for the industrial, scientific and medical (IMS) band. As a result, the system can easily pass various EMI regulations.

Figure 12:
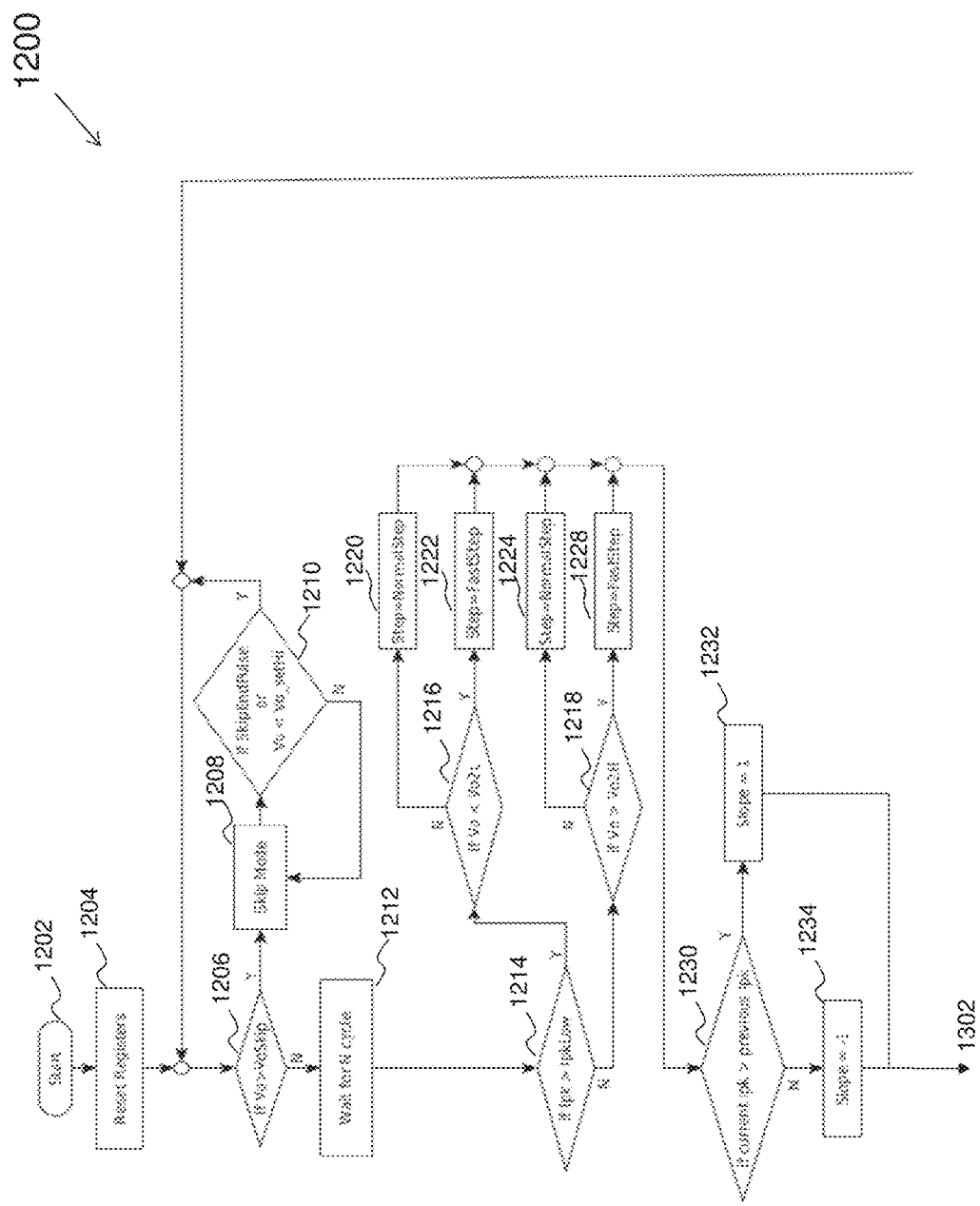
FIG. 12 illustrates a first portion of a flow chart of a method for controlling the output voltage at the receiver side of the wireless power transfer system shown in FIG. 2 in accordance with various embodiments of the present application.
Figure 13:
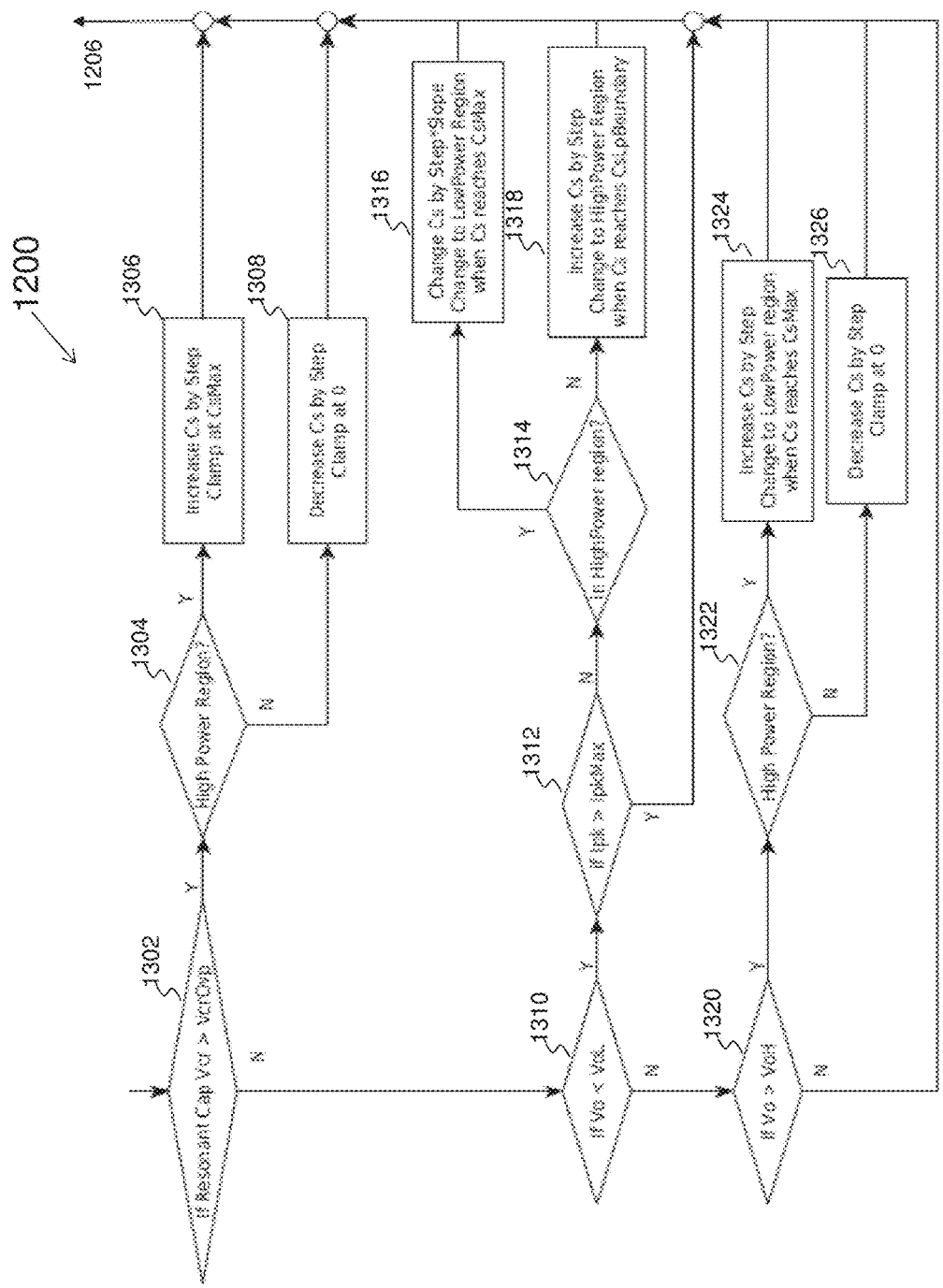
FIG. 13 illustrates a second portion of a flow chart of a method for controlling the output voltage at the receiver side of the wireless power transfer system shown in FIG. 2 in accordance with various embodiments of the present application.

FIGS. 12 and 13 illustrate a flow chart of a method for controlling the output voltage at the receiver side of the wireless power transfer system shown in FIG. 2 in accordance with various embodiments of the present application. This flowchart shown in FIGS. 12-13 is merely an example, which should not unduly limit the scope of the claims. One of ordinary skill in the art would recognize many variations, alternatives, and modifications. For example, various steps illustrated in FIGS. 12-13 may be added, removed, replaced, rearranged and repeated.

The method 1200 starts at step 1202. At step 1204, the digital controller resets a plurality of registers and then proceeds to step 1206. At step 1206, if the output voltage of the receiver exceeds a first chosen threshold value (e.g., a skip mode threshold shown in FIG. 12), the method 1200 proceeds to step 1208.

At step 1208, the receiver enters the skip mode, which has been described in detail with respect to FIG. 11. At step 1210, if the output voltage of the receiver has fallen below a second chosen threshold value (e.g., VoH shown in FIG. 10), or the digital controller generates a command to stop the skip mode, the method 1200 returns to step 1206 as shown in FIG. 12. Also at step 1210, if the output voltage of the receiver still exceeds the second chosen threshold value (e.g., VoH shown in FIG. 10), and/or the digital controller does not generate a command to stop the skip mode, the method 1200 returns to step 1208 as shown in FIG. 12 and the receiver stays at the skip mode.

Referring back to step 1206, if the output voltage of the receiver does not exceed the first chosen threshold value (e.g., a skip mode threshold shown in FIG. 12), the method 1200 proceeds to step 1212. At step 1212, the digital controller waits for N cycles before proceeding to step 1214. It should be noted that N is a predetermined integer.

At step 1214, if the current flowing through the receiver exceeds a third chosen threshold value (e.g., a current threshold), the method 1200 proceeds to step 1216. Otherwise, the method 1200 proceeds to step 1218 as shown in FIG. 12.

At step 1216, the output voltage of the receiver is compared with a fourth chosen threshold value (e.g., a Vo2L shown in FIG. 12). If the output voltage of the receiver is less than the fourth chosen threshold value, the method 1200 proceeds to step 1222 where the step of adjusting the resonant capacitor of the receiver is set to be equal to a first fast step. On the other hand, if the output voltage of the receiver is greater than or equal to the fourth chosen threshold value, the method 1200 proceeds to step 1220 where the step of adjusting the resonant capacitor of the receiver is set to be equal to a first normal step.

Likewise, at step 1218, the output voltage of the receiver is compared with a fifth chosen threshold value (e.g., a Vo2H shown in FIG. 12). If the output voltage of the receiver is greater than the fifth chosen threshold value, the method 1200 proceeds to step 1228 where the step of adjusting the resonant capacitor of the receiver is set to be equal to a second fast step. On the other hand, if the output voltage of the receiver is less than or equal to the fifth chosen threshold value, the method 1200 proceeds to step 1224 where the step of adjusting the resonant capacitor of the receiver is set to be equal to a second normal step.

It should be noted that the first normal step, the second normal step, the first fast step and the second fast step are predetermined. Depending on different applications and design needs, these four steps may vary accordingly.

After the method 1200 sets up the capacitor adjustment speed by selecting one of the four steps above, the method 1200 proceeds to step 1230. At step 1230, the direction of the capacitor adjustment is determined.

Referring back to FIG. 9, the characteristic of the receiver in the region between the high power region and the low power region is nonlinear. In consideration with this non-linear curve, the method 1209 includes monitoring the slope of output power versus the capacitance value of the resonant capacitor in steps 1230, 1232 and 1234. More particularly, this can be achieved by monitoring the peak current of the resonant tank. For example, the digital controller may compare the currents flowing through the resonant tank under two different resonant capacitance values. Through the change of the output power, the slope of the output power can be calculated accordingly. Such a slope versus the capacitance values of the resonant capacitor helps to determine the direction of adjusting the resonant capacitor of the receiver.

As shown in FIG. 12, at step 1230, if the current flowing through the receiver is greater than the current flowing through the receiver in a previous cycle, a control variable SLOPE is set to be equal to 1 at step 1232. Otherwise, the control variable SLOPE is set to be equal to −1. The control variable SLOPE indicates the direction of the capacitor adjustment. After setting up the capacitor adjustment direction, the method 1200 proceeds to step 1302 shown in FIG. 13.

At step 1302, if the voltage across the resonant capacitor exceeds a sixth chosen threshold value (e.g., an overvoltage protection threshold of the resonant capacitor), the method 1200 proceeds to step 1304. At step 1304, if the receiver operates in a high power region as shown in FIG. 9, the method 1200 proceeds to step 1306 where the resonant capacitor is increased until it reaches its max value.

Also at step 1304, if the receiver is not in the high region, the method 1200 proceeds to step 1308 where the resonant capacitor is reduced until it reaches a value approximately equal to zero. After finishing the overvoltage protection steps 1304, 1306 and 1308, the method 1200 returns to step 1206 as shown in FIG. 12.

Referring back to step 1302, if an overvoltage event does not occur, the method 1200 proceeds to steps 1310 and 1320. Steps 1310 and 1320, and the steps executed after them are used to regulate the output voltage of the receiver through adjusting the resonant capacitor of the receiver.

At step 1310, if the output voltage of the receiver is less than VoL shown in FIG. 10, the method 1200 proceeds to step 1312. Otherwise, the method 1200 proceeds to step 1320. At step 1312, if the current flowing through the receiver is greater than a predetermined current threshold, the method 1200 proceeds to step 1206. Also at step 1312, if the current flowing through the receiver is less than or equal to the predetermined current threshold, the method 1200 proceeds to step 1314 where the digital controller determines whether the receiver operates in the high power region. If the receiver operates at the high power region, the method proceeds to step 1316 where the digital controller adjusts the resonant capacitor by a value equal to an adjustment step times an adjustment direction.

It should be noted that the adjustment step has been determined in steps 1220, 1222, 1224 and 1228 described above. The adjustment direction has been determined in steps 1232 and 1234 described above.

At step 1316, after the value of the resonant capacitor reaches its max value, the digital controller changes the operation of the receiver from the high power region to the low power region.

Also at step 1314, if the receiver does not operate at the high power region, the method proceeds to step 1318 where the digital controller increases the value of the resonant capacitor. After the value of the resonant capacitor reaches the boundary of the low power region, the digital controller changes the operation of the receiver from the low power region to the high power region. After executing step 1316 and step 1318, the method 1200 returns to step 1206.

Referring back to step 1320, if the output voltage of the receiver is greater than VoH shown in FIG. 10, the method 1200 proceeds to step 1322. Otherwise, the method 1200 returns to step 1206.

At step 1322, the digital controller determines whether the receiver operates in the high power region. If the receiver operates at the high power region, the method 1200 proceeds to step 1324 where the digital controller increases the value of the resonant capacitor. After the value of the resonant capacitor reaches its max value, the digital controller changes the operation of the receiver from the high power region to the low power region.

Also at step 1322, if the receiver does not operate at the high power region, the method 1200 proceeds to step 1326 where the digital controller reduces the value of the resonant capacitor until it reaches a value approximately equal to zero. After executing step 1324 and step 1326, the method 1200 returns to step 1206.

The description above outlines the control mechanisms employed in both the low power region and the high power region. In a practical application, it is possible to operate a system only in a lower power region or a high power region in steady state. In addition, with the variable capacitor network discussed above, various in-band communication methods become possible through combining the conventional load modulation technique with the resonant capacitance modulation technique.

Figure 14:
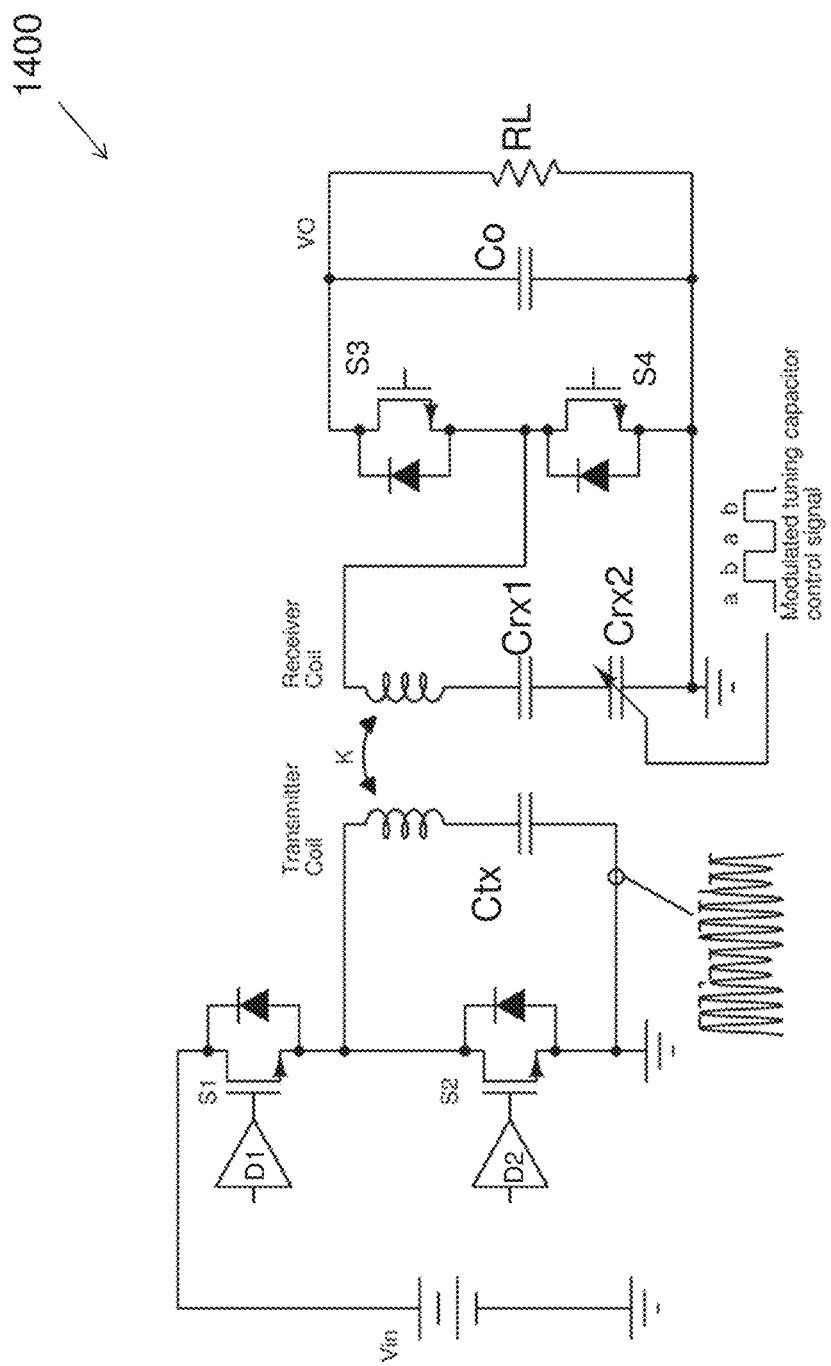
FIG. 14 illustrates a control scheme including both the resonant capacitance modulation technique and the in-band communication technique in accordance with various embodiments of the present application.

FIG. 14 illustrates a control scheme including both the resonant capacitance modulation technique and the in-band communication technique in accordance with various embodiments of the present application. The wireless power transfer system 1400 includes a transmitter and a receiver. The transmitter of FIG. 14 is similar to the transmitter shown in FIG. 3 except that the transmitter of FIG. 14 does not include an EMI filter. Likewise, the receiver shown in FIG. 14 is similar to the receiver shown in FIG. 8 except that the receiver of FIG. 14 does not include an EMI filter. It should be noted the transmitter EMI filter and the receiver EMI filter may be added into FIG. 14 depending on different applications and design needs.

As shown in FIG. 14, information can be sent from a receiver to a transmitter. Such information can be used to ensure the authenticity of the receiver system before the transmitter transfers full power to the receiver. Such information can also be used to start, change or stop an operation or an operation mode of the transmitter. Furthermore, it can be used to change a parameter of the transmitter such as a coil current, an input voltage applied to the power amplifier and/or the status of the receiver.

In addition to a direct sense of the voltage or current signal for decoding, it is also possible to use other information for this purpose. For example, the modulation of the receiver resonant capacitance may result in a change of the transmitter resonant capacitance due to the change of the turn-off current after some delay. Therefore, the change of the resonant capacitance in the transmitter can be used independently or in combination with a current/voltage signal for a decoding purpose.

Similarly, the methods described above can be used to send a signal from one transmitter to one receiver or from one transmitter to a plurality of receivers. For example, the coil current or the capacitance of the resonant capacitor of a transmitter can be modulated to represent a communication signal, and through a current change, voltage change and/or resonant capacitor capacitance change in a receiver coupled to the transmitter, such information can be decoded in the receiver.

With the methods described above, the communication can be made even during the power transfer between a transmitter and a receiver. For example, the decoding process may detect the relative change of corresponding variables, although absolute values may also be used. Also, the availability of multiple responses (current, voltage and/or resonant capacitance) can also be used to improve the quality of the communication.

In some operation modes, the communication can occur in a low power mode, in which the transmitter current is reduced to a safe level to avoid excessive voltage stresses, current stresses, and/or power losses. Under this low power mode, the load of a receiver coupled to the transmitter is forced to be a low value or to be approximately equal to zero. Also, a communication circuit may be coupled to a main power coil, such as a transmitter coil or a receiver coil. Alternatively, a communication signal may be coupled to an auxiliary coil.

Figure 15:
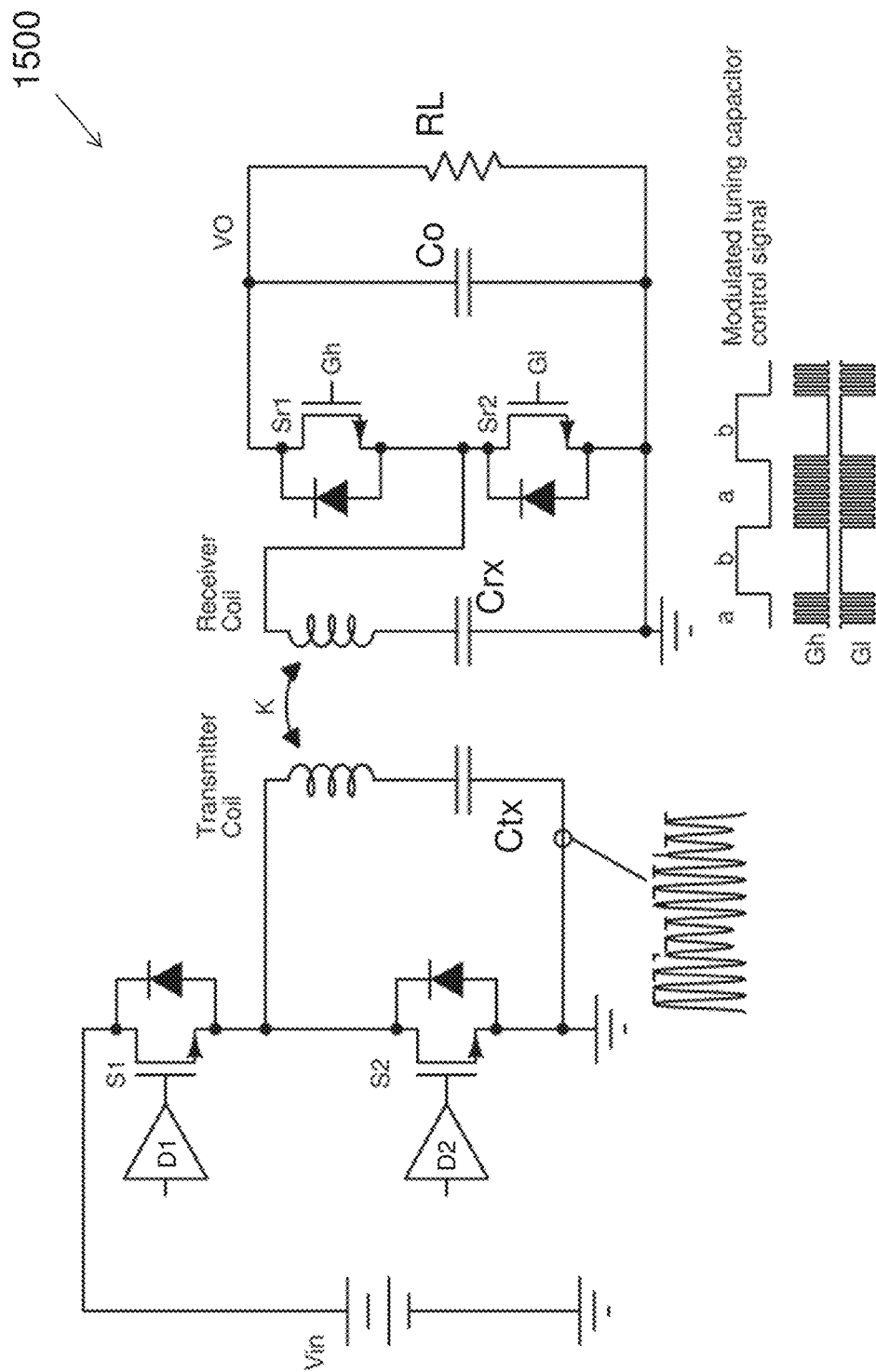
FIG. 15 illustrates a control scheme including both the skip-mode control technique and the in-band communication technique in accordance with various embodiments of the present application.

FIG. 15 illustrates a control scheme including both the skip-mode control technique and the in-band communication technique in accordance with various embodiments of the present application. The wireless power transfer system 1500 is similar to that shown in FIG. 14, and hence is not discussed in detail.

In some embodiments, when a synchronous rectifier is used in a receiver (Sr1 and Sr2 in FIG. 15), the power flow is reversible. This can be implemented by controlling the operation of the receiver. For example, the receiver can function as a transmitter. This can provide more option to implement more system features.

The control of the synchronous rectifier can also be used as a communication means. FIG. 15 illustrates an example. Suppose the load is approximately equal to zero or very small. Sr2 can be turned on and off in a pattern at a frequency significantly lower than the transmitter switching frequency according to the information to be sent (Sr1 is kept off during the time when Sr2 is on) without affecting the output voltage too much. Then, a current/voltage or the value of the resonant capacitance in the transmitter may change in response to the switching of Sr2. Such changes can be used to decode the information.

During the communication process, the resonant capacitance of the receiver may be kept at a suitable value. Alternatively, the resonant capacitance of the receiver can change according to the status of Sr2. Similarly, the switching of the other switch such as Sr1 can be used for the communication purpose. For example, when the power transferred to the output of the receiver is approximately equal to zero, Sr1 may be kept on to fulfill the communication purpose.

To get a better communication quality, the load connected to the output of the receiver may be controlled in a suitable manner corresponding to the communication. For example, the load may be kept at zero or very low during the communication. The modulation of the synchronous rectifier may be used in combination with the resonant capacitance modulation discussed above if desired.

Figure 16:
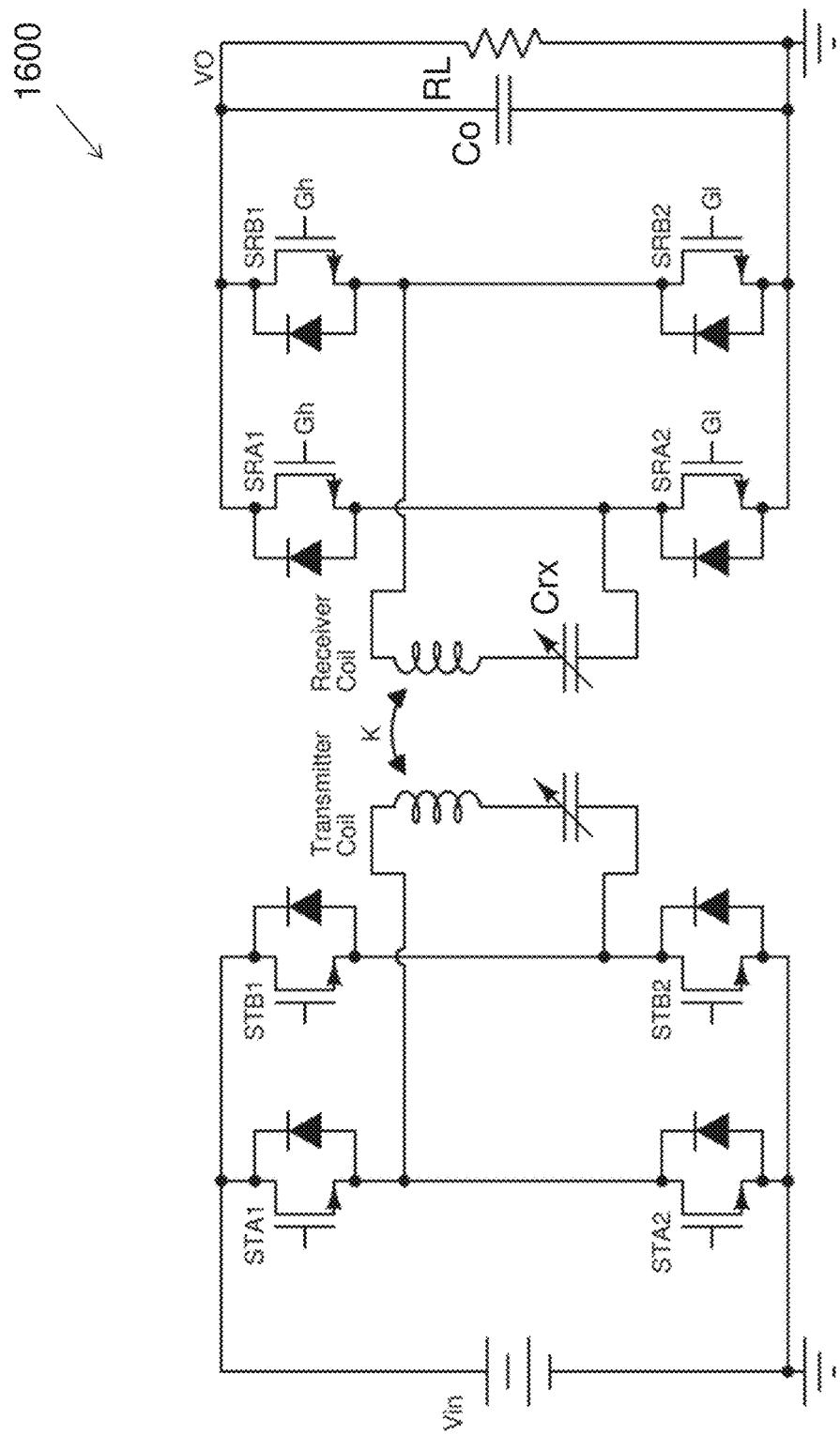
FIG. 16 illustrates a full-bridge configuration based high frequency wireless power transfer system in accordance with various embodiments of the present application.

FIG. 16 illustrates a full-bridge configuration based high frequency wireless power transfer system in accordance with various embodiments of the present application. The wireless power transfer system 1500 is similar to that shown in FIG. 14 except that the transmitter side includes four switches STA1, STA2, STB1 and STB2, and the receiver side includes four switches SRA1, SRA2, SRB1 and SRB2.

FIG. 16 shows both the receiver and the transmitter include a variable capacitor or a variable capacitance network. By adjusting the transmitter's variable capacitor, the soft switching such as ZVS of the transmitter switches can be achieved. By adjusting the receiver's variable capacitor, the output voltage, current and/or power can be adjusted.

It should be noted that circuit shown in FIG. 16 is merely an example, which should not unduly limit the scope of the claims. One of ordinary skill in the art would recognize many variations, alternatives, and modifications. For example, the transmitter side could be implemented as a half bridge while the receiver could be implemented as a full bridge. With the full bridge configuration, all the control methods discussed before could still be implemented to control the turn off current of all four switches in the full bridge and the output voltage on the receiver side.

It should further be noted that a full bridge circuit can be configured in a full bridge mode where all four switches are switched every switch cycle, or in a half bridge mode where two switches in a switch leg are switched in every switch cycle, but the other two switches in the other switch leg are not switched. Alternatively, one switch in the non-switching leg is in "ON" state while the other switch in the same leg is in "OFF" state.

A transmitter or receiver could switch between the full bridge mode and the half bridge mode, and operate in the full bridge mode in one power range and the half-bridge mode in a different power range. For example, a receiver could be configured as a full bridge when it is operating in a high power range, and converted into a half bridge mode when it enters into a low power range, or vice versa. With these mode variations, the system performance could be improved under different operating condition.

The above discussion is related to a system where both the transmitter and the receiver adopt the resonant capacitor modulation technique. However, with reasonable modifications, most of the discussed techniques can be used in a system where either the transmitter or the receiver does not use the resonant capacitor modulation technique. For example, one side may just use the traditional A4WP architecture.

Moreover, the techniques discussed above can be used in a multiple receiver systems where some of the receivers use the resonant capacitor modulation technique while the other receivers do not adopt the resonant capacitor modulation technique.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
 a sense transistor having a gate and a source directly connected to a gate and a source of a power transistor of a resonant converter respectively, wherein the resonant converter comprises a primary side comprising a primary switch network coupled to a power source, and wherein the primary switch network comprises a plurality of primary switches, a primary resonant tank coupled to the plurality of primary switches, and wherein the primary resonant tank comprises a first variable capacitance network, a primary coil coupled to the primary resonant tank, and a secondary side comprising a secondary coil magnetically coupled to the primary coil, a secondary resonant tank coupled to the secondary coil and a secondary rectifier comprising a plurality of secondary switches;

a current sense and amplification circuit comprising an amplifier having inputs connected to a drain of the sense transistor and a drain of the power transistor, respectively;

an analog-to-digital converter connected to an output of the current sense and amplification circuit; and a digital controller connected to an output of the analog-to-digital converter, wherein the digital controller is configured to modulate a variable capacitance network of the resonant converter based upon a current flowing through the sense transistor.

2. The apparatus of claim 1, wherein:
the digital controller is configured to modulate the variable capacitance network to improve soft switching of a plurality of power switches of the primary side of the resonant converter.

3. The apparatus of claim 1, wherein:
the digital controller is configured to modulate the variable capacitance network to regulate an output voltage of the resonant converter within a predetermined range.

4. The apparatus of claim 1, wherein:
the power transistor is a low side switch of the plurality of primary switches.

5. The apparatus of claim 1, wherein:
the power transistor is a low side switch of the plurality of secondary switches.

6. The apparatus of claim 1, wherein:
the secondary resonant tank comprises a second variable capacitance network.

7. The apparatus of claim 1, wherein the variable capacitance network comprises:
a first capacitor-switch network comprising a first capacitor and a first switch connected in series;
a second capacitor-switch network comprising a second capacitor and a second switch connected in series; and
a third capacitor-switch network comprising a third capacitor and a third switch connected in series, and wherein:
the first capacitor-switch network, the second capacitor-switch network and the third capacitor-switch network are connected in parallel to each other; and
capacitance values of the first capacitor, the second capacitor and the third capacitor are in binary increments.

8. The apparatus of claim 1, wherein the current sense and amplification circuit comprises:
a sample and hold circuit coupled between the output of the amplifier and an input of the analog-to-digital converter.

9. A device comprising:
a power amplifier comprising a high side switch and a low side switch connected in series;
a first coil coupled to a common node of the high side switch and the low side switch, wherein the first coil is configured to be magnetically coupled to a second coil;
a variable capacitance network connected in series with the first coil;
a filter connected between the power amplifier and the variable capacitance network, wherein the filter comprises a first harmonic trap circuit and a second harmonic trap circuit connected in series, and a first harmonic notch circuit and a second harmonic notch circuit connected in parallel;

a sense switch connected in parallel with the low side switch, wherein a gate of the sense switch is connected to a gate of the low side switch; and a current sensing circuit comprising an amplifier having inputs connected to a drain of the sense switch and a drain of the low side switch, respectively.

10. The device of claim 9, wherein:
a resonant frequency of the first harmonic trap circuit is substantially equal to a resonant frequency of the first harmonic notch circuit, and wherein the first harmonic trap circuit and the first harmonic notch circuit are configured to suppress a third harmonic;
the second harmonic trap circuit is configured to suppress a fifth harmonic; and
the second harmonic notch circuit is configured to suppress a seventh harmonic.

11. The device of claim 9, further comprising:
a sample and hold circuit coupled to an output of the amplifier;
an analog-to-digital converter coupled to an output of the sample and hold circuit; and
a digital controller connected to an output of the analog-to-digital converter, wherein the digital controller is configured to modulate the variable capacitance network based upon a current flowing through the low side switch.

12. The device of claim 9, wherein:
an output of the amplifier is coupled to a current source, and wherein a current generated by the current source is regulated by the amplifier and the current generated by the current source is proportional to a current flowing through the low side switch.

13. The device of claim 9, wherein:
the variable capacitance network comprises a diode, a resistor connected in parallel with the diode and a plurality of capacitor-switch networks connected in parallel with the diode.

14. An apparatus comprising:
a power amplifier coupled to an input power source;
a first resonant tank comprising a first variable capacitance network and a first coil, wherein the first coil is between the power amplifier and the first variable capacitance network;
a second resonant tank comprising a second variable capacitance network and a second coil magnetically coupled to the first coil;
a filter connected between the power amplifier and the first variable capacitance network, wherein the filter comprises a first harmonic trap circuit and a second harmonic trap circuit connected in series, and a first harmonic notch circuit and a second harmonic notch circuit connected in parallel; and
a sensing device comprising a sense switch and an amplifier, wherein:
a gate of the sense switch is connected with a gate of a low side switch of the power amplifier; and
the amplifier has two inputs connected to a drain of the sense switch and a drain of the low side switch, respectively.

15. The apparatus of claim 14, wherein:
the low side switch, the sense switch and the amplifier are in a same silicon chip.

16. The apparatus of claim 14, wherein:
an output of the amplifier is coupled to a current source, and wherein a current from the current source is regulated by the amplifier so that the current from the current source is proportional to a current flowing through the low side switch.

17. The apparatus of claim 16, wherein the first variable capacitance network comprises:
a diode and a resistor connected in parallel, and wherein an anode of the diode is connected to ground; and
a plurality of capacitor-switch networks connected in parallel with the diode.

18. The apparatus of claim 17, wherein:
a control signal is configured to control the plurality of capacitor-switch networks, and wherein the control signal is generated based on the current from the current source.

* * * * *